US008748901B1

(12) United States Patent
Takahashi et al.

(10) Patent No.: US 8,748,901 B1
(45) Date of Patent: Jun. 10, 2014

(54) SILICON CARBIDE SEMICONDUCTOR ELEMENT

(71) Applicant: Panasonic Corporation, Osaka (JP)

(72) Inventors: Kunimasa Takahashi, Osaka (JP);
Masahiko Niwayama, Kyoto (JP);
Masao Uchida, Osaka (JP); Chiaki Kudou, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/172,075

(22) Filed: Feb. 4, 2014

Related U.S. Application Data

(62) Division of application No. 13/816,571, filed as application No. PCT/JP2012/004103 on Jun. 25, 2012.

(30) Foreign Application Priority Data

Jun. 27, 2011 (JP) .................... 2011-141991

(51) Int. Cl.
H01L 31/0312 (2006.01)

(52) U.S. Cl.
USPC ............................. 257/77; 257/216; 438/270

(58) Field of Classification Search
USPC .................. 257/77, 216, 219, 326, E29.256, 257/E29.068; 438/270
See application file for complete search history.

(56) References Cited

U.S. PATENT DOCUMENTS

| 5,976,936 | A | 11/1999 | Miyajima et al. |
| 6,040,600 | A | 3/2000 | Uenishi et al. |
| 6,103,578 | A | 8/2000 | Uenishi et al. |
| 7,381,992 | B2 * | 6/2008 | Ryu ................................ 257/77 |
| 8,133,787 | B2 * | 3/2012 | Endo .............................. 438/275 |
| 8,476,733 | B2 * | 7/2013 | Takahashi et al. ............ 257/504 |
| 2001/0053561 | A1 | 12/2001 | Kitabatake et al. |
| 2008/0073707 | A1 | 3/2008 | Darwish |

(Continued)

FOREIGN PATENT DOCUMENTS

| JP | 09-074193 A | 3/1997 |
| JP | 10-223896 A | 8/1998 |

(Continued)

OTHER PUBLICATIONS

International Search Report for corresponding International Application No. PCT/JP2012/004103 mailed Jul. 24, 2012.

(Continued)

Primary Examiner — Phuc Dang
(74) Attorney, Agent, or Firm — Renner, Otto, Boisselle & Sklar, LLP

(57) ABSTRACT

This silicon carbide semiconductor element includes: a body region of a second conductivity type which is located on a drift layer of a first conductivity type; an impurity region of the first conductivity type which is located on the body region; a trench which runs through the body region and the impurity region to reach the drift layer; a gate insulating film which is arranged on surfaces of the trench; and a gate electrode which is arranged on the gate insulating film. The surfaces of the trench include a first side surface and a second side surface which is opposed to the first side surface. The concentration of a dopant of the second conductivity type is higher at least locally in a portion of the body region which is located beside the first side surface than in another portion of the body region which is located beside the second side surface.

9 Claims, 17 Drawing Sheets

(56) References Cited

U.S. PATENT DOCUMENTS

| | | |
|---|---|---|
| 2008/0153216 A1 | 6/2008 | Kumar et al. |
| 2009/0146154 A1* | 6/2009 | Zhang et al. .................... 257/77 |
| 2009/0200559 A1 | 8/2009 | Suzuki et al. |
| 2009/0242976 A1 | 10/2009 | Hino |
| 2010/0044794 A1 | 2/2010 | Cheng |
| 2011/0201187 A1 | 8/2011 | Nishiwaki et al. |
| 2011/0204383 A1 | 8/2011 | Yamamoto et al. |
| 2012/0132926 A1 | 5/2012 | Nakano et al. |
| 2012/0248462 A1 | 10/2012 | Wada et al. |
| 2012/0280255 A1 | 11/2012 | Masuda et al. |

FOREIGN PATENT DOCUMENTS

| | | |
|---|---|---|
| JP | 2004-055976 A | 2/2004 |
| JP | 2005-333068 A | 12/2005 |
| JP | 2007-165657 A | 6/2007 |
| JP | 2008-311406 A | 12/2008 |

OTHER PUBLICATIONS

Chen et al., "Homoepitaxial Growth of 4H-SiC on Trenched Substrates by Chemical Vapor Deposition", Materials Science Forum, vols. 457-460 (2004) pp. 189-192.

* cited by examiner

*FIG.14*
(a)
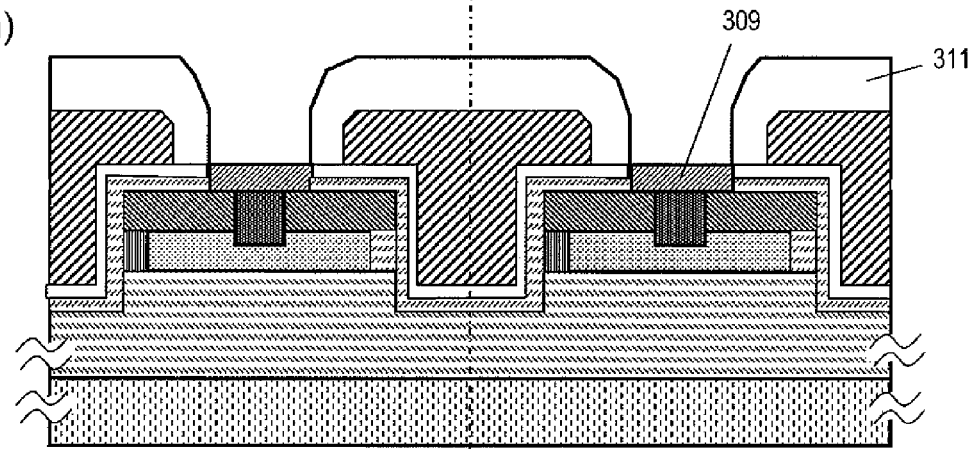
(b)
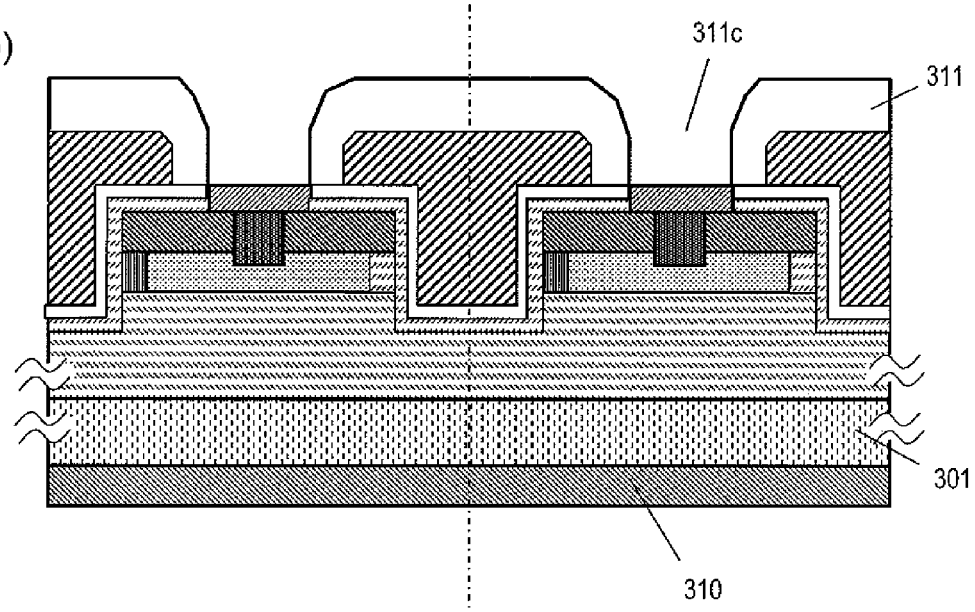

SILICON CARBIDE SEMICONDUCTOR ELEMENT

TECHNICAL FIELD

The present invention relates to a semiconductor element that uses silicon carbide and a method for producing such an element. More particularly, the present application relates to a silicon carbide semiconductor element which can be used in applications that require a high breakdown voltage and a large amount of current.

BACKGROUND ART

Silicon carbide (SiC) has a wider band gap and a higher dielectric breakdown voltage than silicon (Si), and therefore, is expected to be the best semiconductor material to make a next-generation low-loss power device. SiC has a lot of poly-types including cubic ones such as 3C—SiC and hexagonal ones such as 6H—SiC and 4H—SiC. Among these various poly-types, the one that is used generally to make a practical silicon carbide semiconductor element is 4H—SiC.

A metal-insulator-semiconductor field-effect transistor (MISFET) is a typical semiconductor element among various power elements that use SiC (see Patent Document No. 1, for example). In this description, a MISFET of SiC will sometimes be simply referred to herein as a "SiC-FET". And a metal-oxide-semiconductor field-effect transistor (MOSFET) is one of those MISFETs.

FIG. 18 is a cross-sectional view illustrating a traditional trench type semiconductor element (SiC-FET) 1000. The semiconductor element 1000 includes a plurality of unit cells 1000*u*. The semiconductor element 1000 is made of a silicon carbide (SiC) semiconductor and has a structure in which an n$^-$-drift layer 1020 is stacked on an n$^+$-substrate (SiC substrate) 1010. A p-body region 1030 has been defined over the n$^-$-drift layer 1020. A p$^+$-body contact region 1050 and an n$^+$-source region 1040 have been defined on the p-body region 1030. And a source electrode 1090 has been formed on the p$^+$-body contact region 1050 and the n$^+$-source region 1040. The semiconductor element 1000 has a trench 1020*t*, which may have a groove shape that runs through the source region 1040 and the p-body region 1030 to reach the drift layer 1020. On the sidewall of that trench 1020*t*, an n$^-$-channel layer 1060 which connects together the n$^+$-source region 1040 and the drift layer 1040 has been grown epitaxially. Further formed on the drift layer 1020 at the bottom of the trench 1020*t*, the n$^+$-source region 1040, and the channel layer 1060 are a gate insulating film 1070 and a gate electrode 1080. Meanwhile, a drain electrode 1100 has been formed on the back surface of the n$^+$-substrate 1010.

The source electrode 1090 is connected in parallel to the respective source electrodes of other cells with an upper interconnect electrode 1120. This upper interconnect electrode 1120 and the gate electrodes 1080 are electrically insulated from each other by an interlevel dielectric film 1110. The interlevel dielectric film 1110 has a plurality of holes 1110*c*, at which the upper interconnect electrode 1120 contacts with the source electrodes 1090. A lower interconnect electrode 1130 is arranged on the drain electrode 1100. By bonding the lower interconnect electrode 1130 with solder during a mounting process, this semiconductor element 1000 is fixed onto a leadframe or a module.

It was reported that when an epitaxial growth process was carried out on an SiC substrate through which trenches had been formed, the epitaxial film had different thicknesses on two opposing side surfaces of each of those trenches (see Non-Patent Document No. 1). If those side surfaces of a trench are perpendicular to the off-axis angle direction of the SiC substrate, then facets are formed around a shoulder portion on one side of the trench. In this case, the facets are (0001) planes that are basal planes of the SiC substrate. To the sidewall surface of the trench that is closer to those facets, a source gas that has not contributed to growth at those facets is supplied. They believe that the epitaxial film comes to have an increased thickness in this manner at the trench sidewall surface closer to those facets.

CITATION LIST

Patent Literature

Patent Document No. 1: Japanese Laid-Open Patent Publication No. 9-74193

Non-Patent Literature

Non-Patent Document No. 1: Materials Science Forum Vols. 457-460

SUMMARY OF INVENTION

Technical Problem

A non-limiting, exemplary embodiment of the present application provides an SiC semiconductor element which can still minimize deterioration in performance even if the element structures are different on two opposing side surfaces in a trench.

Solution to Problem

To overcome the problem, a silicon carbide semiconductor element according to an aspect of the present disclosure includes: a semiconductor substrate of a first conductivity type; a drift layer of the first conductivity type which is located on the principal surface of the semiconductor substrate; a body region of a second conductivity type which is located on the drift layer; an impurity region of the first conductivity type which is located on the body region; a trench which runs through the body region and the impurity region to reach the drift layer; a gate insulating film which is arranged on surfaces of the trench; a gate electrode which is arranged on the gate insulating film; a first electrode which contacts with the impurity region; and a second electrode which is arranged on the back surface of the semiconductor substrate. The surfaces of the trench include a first side surface and a second side surface which is opposed to the first side surface. The concentration of a dopant of the second conductivity type is higher at least locally in a portion of the body region which is located beside the first side surface than in another portion of the body region which is located beside the second side surface.

Advantageous Effects of Invention

An SiC semiconductor element according to such an aspect of the present disclosure can still minimize deterioration in performance even if the element structures are different on two opposing side surfaces in a trench.

BRIEF DESCRIPTION OF DRAWINGS

FIGS. 14 (a) and (b) are cross-sectional views illustrating respective manufacturing process steps to produce the semiconductor element 300 of the second embodiment.

DESCRIPTION OF EMBODIMENTS

Figure 1:
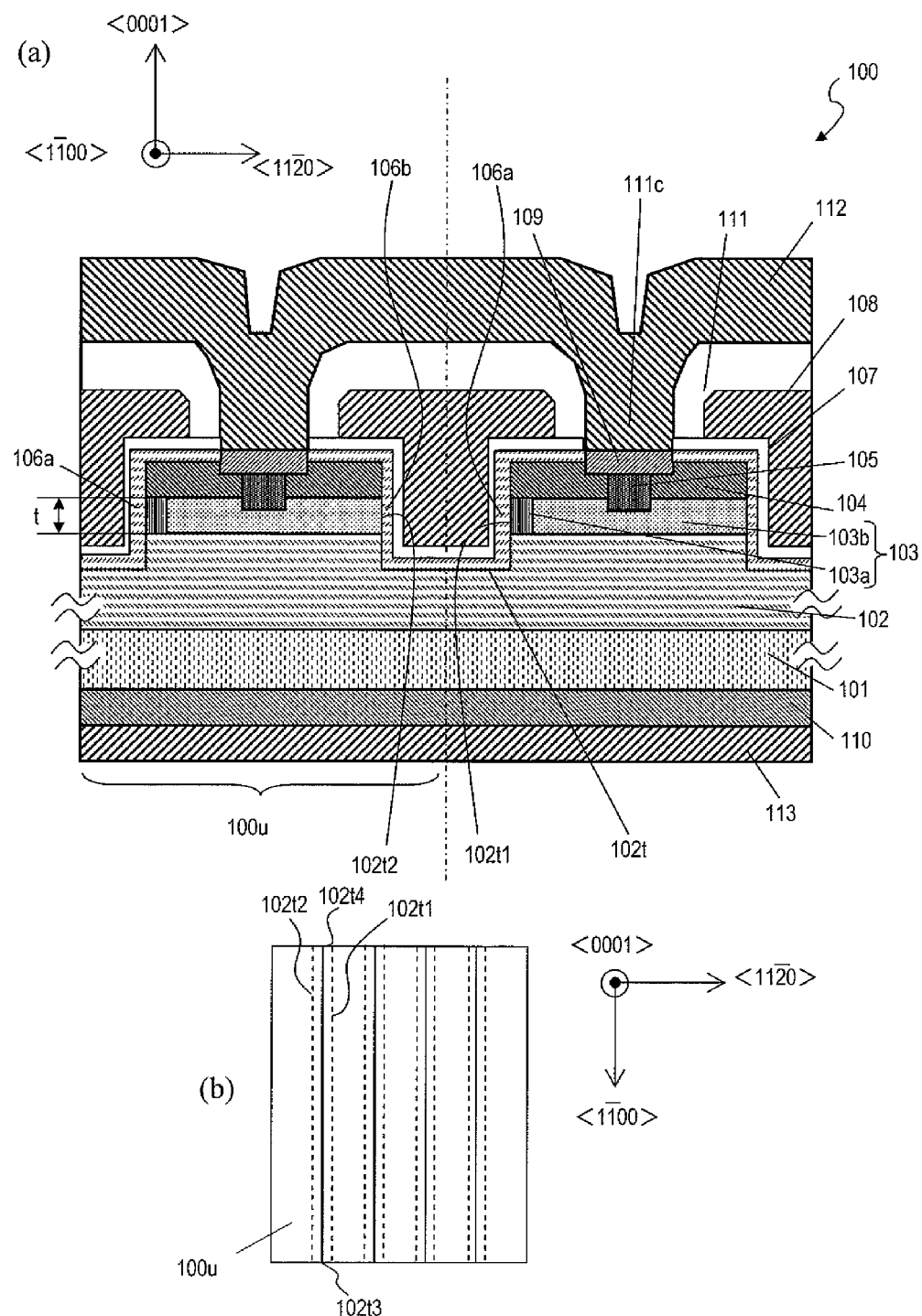
FIG. 1 (*a*) is a schematic cross-sectional view illustrating a semiconductor element 100 as a first exemplary embodiment and (b) is a plan view illustrating an exemplary arrangement in a situation where rectangular unit cells 100u run.

The present inventors discovered that in a MISFET with a trench structure, if either a channel layer that had been epitaxially grown on two opposing side surfaces of the trench or a gate insulating film formed on those side surfaces had different thicknesses there, the threshold voltages were also different on those two opposing side surfaces of the trench, which is a problem.

If the threshold voltages are different between the two opposing side surfaces of a trench in this manner, then the threshold voltage of the MISFET is determined by the lower one of the two threshold voltages. However, since no current flows through the side surface with the higher threshold voltage, the ON-state resistance increases there. In addition, if the threshold voltages are different between the two opposing side surfaces inside a trench, the swing characteristic, which is defined by a gate voltage to be applied to increase the drain current by one digit, deteriorates.

The present inventors discovered that if the concentration of a dopant of a second conductivity type in a body region, which contacts with a channel layer (epitaxial layer) to be grown on those two opposing side surfaces of a trench in a trench gate MISFET, is controlled according to the thickness of the channel layer or a gate insulating film, such a difference in threshold voltage between those two opposing side surfaces of the trench (which will be referred to herein as "first and second side surfaces") can be reduced. Hereinafter, an SiC semiconductor element which can check an increase in ON-state resistance and which can suppress deterioration in swing characteristic will be described.

A silicon carbide semiconductor element according to the present disclosure has a structure in which the concentration of a dopant of the second conductivity type is higher at least at some depth of a portion of the body region which is located beside the first side surface of a trench than in another portion of the body region which is located beside the second side surface.

(1) A silicon carbide semiconductor device according to an aspect of the present disclosure includes: a semiconductor substrate of a first conductivity type; a drift layer of the first conductivity type which is located on the principal surface of the semiconductor substrate; a body region of a second conductivity type which is located on the drift layer; an impurity region of the first conductivity type which is located on the body region; a trench which runs through the body region and the impurity region to reach the drift layer; a gate insulating film which is arranged on surfaces of the trench; a gate electrode which is arranged on the gate insulating film; a first electrode which contacts with the impurity region; and a second electrode which is arranged on the back surface of the semiconductor substrate. The surfaces of the trench include a first side surface and a second side surface which is opposed to the first side surface. The concentration of a dopant of the second conductivity type is higher at least locally in a portion of the body region which is located beside the first side surface than in another portion of the body region which is located beside the second side surface.

(2) In (1), a body concentration adjusting region including the dopant of the second conductivity type in a higher concentration than the body region may be provided at least in some depth range of the portion of the body region which is located beside the first side surface.

(3) In (1) or (2), a body concentration adjusting region including the dopant of the second conductivity type in a lower concentration than the body region may be provided at least in some depth range of the portion of the body region which is located beside the second side surface.

(4) The element of one of (1) to (3) may further include a channel layer of the first conductivity type which is arranged between the first and second side surfaces of the trench and the gate insulating film.

(5) In one of (1) to (4), a portion of the channel layer which contacts with a part of the body region that is exposed on the first side surface may be thicker than another portion of the channel layer which contacts with another part of the body region that is exposed on the second side surface.

(6) In one of (1) to (5), a portion of the gate insulating film which is arranged on that part of the body region that is exposed on the first side surface may be thinner than another portion of the gate insulating film which is arranged on that part of the body region that is exposed on the second side surface.

(7) In one of (1) to (6), the semiconductor substrate may be a 4H—SiC substrate, of which the principal surface defines a tilt angle of 2 to 10 degrees with respect to either a (0001) Si (silicon) plane or a (000-1) C (carbon) plane.

(8) In the silicon carbide semiconductor device of one of (1) to (7), the first and second side surfaces may be arranged substantially perpendicularly to the direction in which the principal surface of the semiconductor substrate tilts with respect to the (0001) Si plane or the (000-1) C plane.

(9) In one of (1) to (8), the principal surface of the semiconductor substrate may tilt in a <11-20> direction with respect to the (0001) Si plane or the (000-1) C plane and the first and second side surfaces may be arranged substantially perpendicularly to the <11-20> direction.

(10) In (4), the channel layer of the first conductivity type may have been formed by epitaxial growth.

(11) In one of (1) to (10), a difference in threshold voltage between the two opposing sidewall surfaces of the trench may be equal to or smaller than 0.1 V.

(12) In one of (1) to (11), when viewed perpendicularly to the principal surface of the semiconductor substrate, the trench may have the shape of a rectangle on a plan view, and the first and second side surfaces may form the longer sides of the rectangle.

(13) A method for producing a silicon carbide semiconductor device according to an aspect of the present invention includes the steps of: (a) providing a semiconductor substrate, of which the principal surface is already covered with a drift layer of a first conductivity type; (b) forming a body region of a second conductivity type on the drift layer; (c) forming, in the drift layer, a body concentration adjusting region of the second conductivity type which includes a dopant of the second conductivity type in a different concentration from the body region; (d) forming an impurity region of the first conductivity type on the body region; (e) subjecting the semiconductor substrate to an annealing process for activation; (f) forming a trench which runs through the body region and the impurity region by etching; (g) forming a gate insulating film on the surface of the trench; (h) forming a gate electrode in contact with the gate insulating film; (i) forming a first electrode in contact with the impurity region; and (j) forming a second electrode on another surface of the semiconductor substrate that is opposed to the principal surface. The step (f) includes forming a trench which has a first side surface and a second side surface, which is opposed to the first side surface, so that the body concentration adjusting region is exposed on the first side surface.

(14) In (13), the step (c) may include forming the body concentration adjusting region of the second conductivity type by implanting ions of the second conductivity type into the body region.

(15) In (13), the step (c) may include forming the body concentration adjusting region of the second conductivity type by implanting ions of the first conductivity type into the body region.

Hereinafter, an SiC semiconductor device as an embodiment of the present invention will be described in detail with reference to the accompanying drawings.

Embodiment 1

FIG. 1(*a*) is a schematic cross-sectional view illustrating a semiconductor element 100 as a first embodiment of the present invention. In FIG. 1(*a*), illustrated are two adjacent unit cells 100*u* of the semiconductor element 100. FIG. 1(*b*) is a plan view illustrating how a number of unit cells may be arranged. The semiconductor element 100 of this embodiment is a semiconductor element including a MISFET.

As shown in FIG. 1(*a*), the semiconductor element 100 of this embodiment includes a silicon carbide semiconductor substrate 101 of a first conductivity type and a drift layer (first silicon carbide semiconductor layer) 102 of the first conductivity type which has been formed on the surface of the substrate 101. The principal surface of the substrate 101 tilts from a (0001) plane rightward (toward a <11-20> direction) at an angle of approximately 4 degrees. That is to say, a vector representing a normal to the principal surface of the substrate 101 tilts in the <11-20> direction and defines a tilt angle of approximately 4 degrees with respect to a vector representing a normal to a (0001) plane. In the following description, the tilt angle defined by the vector representing a normal to the principal surface of the substrate 101 with respect to the vector representing a normal to a (0001) plane will be referred to herein as an "off-axis angle". The drift layer 102 may be formed by epitaxial growth. In this embodiment, the silicon carbide semiconductor substrate 101 is an $n^+$-substrate ($n^+$-SiC substrate) and the drift layer 102 is an $n^-$-drift layer. Alternatively, a substrate, of which the principal surface tilts in a <11-20> direction with respect to a (000-1) plane, may also be used.

A body region 103 of a second conductivity type has been formed on (or in) the drift layer 102. A source region 104 of the first conductivity type has been formed on the body region 103. The source region 104 corresponds to an impurity region of the first conductivity type according to the present invention.

The body region 103 of this embodiment includes a first portion and a second portion, which function as a "body concentration adjusting region 103*a*" and the "rest 103*b* of the body region 103 other than the body concentration adjusting region 103*a*", respectively. In the following description, the "rest 103*b* of the body region 103 other than the body concentration adjusting region 103*a*" will be sometimes referred to herein as a "second portion 103*b*". In this embodiment, the body concentration adjusting region 103*a* is a $p^+$-type region and the second portion 103*b* is a p-type region. The source region 104 is an $n^+$-type region. The concentration of a p-type dopant is set to be higher in the body concentration adjusting region 103*a* than in the body region 103. In this description, if "the concentration of a p-type dopant is set to be higher in the body concentration adjusting region 103*a* than in the body region 103", then it means that when the concentrations of a p-type dopant are compared at the same depth between the body concentration adjusting region 103*a* and the body region 103, the concentration of the p-type dopant is set to be higher in the body concentration adjusting region 103*a* than in the body region 103.

A source electrode 109 has been formed on the source region 104. Specifically, the source electrode 109 has been formed to cover, and to make electrical contact with, both of the $n^+$-source region 104 and a $p^+$-contact region 105. The $p^+$-contact region 105 further makes electrical contact with the body region 103, too. The source electrode 109 corresponds to the first electrode according to the present invention.

This semiconductor element 100 has a trench 102*t* which runs through the source region 104 and the body region 103. The trench 102*t* has been formed substantially perpendicularly to the principal surface. In this embodiment, the trench 102*t* has a first side surface 102*t*1 and a second side surface 102*t*2 and has been formed so that the first and second side surfaces 102*t*1 and 102*t*2 thereof are substantially perpendicular to the <11-20> direction. In this case, if a substrate which defines an off-axis angle with respect to either a (0001) Si plane or a (000-1) C plane is used as the substrate 101, the off-axis direction may be the <11-20> direction, for example. In that case, the first and second side surfaces 102t1 and 102t2 are arranged so as to intersect with the off-axis direction at substantially right angles.

On the first side surface 102t1, exposed is the body concentration adjusting region 103a. On the other hand, on the second side surface 102t2, exposed is the second portion 103b of the body region 103. Thus, the concentration of the p-type dopant is higher at least locally in a portion of the body region 103 which is located beside the first side surface 102t1 than in another portion of the body region 103 which is located beside the second side surface 102t2.

In the trench 102t, a channel layer (epitaxial layer) 106 has been formed to make at least partial contact with the n⁻-drift layer 102, the body region 103, and the n⁺-source region 104. Portions of the channel layer 106 which contact with the p-body concentration adjusting region 103a and the second portion 103b will be referred to herein as a "first channel region 106a" and a "second channel region 106b", respectively.

The first channel region 106a which contacts with the p-body concentration adjusting region 103a is thicker than the second channel region 106b which contacts with the second portion 103b. In this description, if "the first channel region 106a which contacts with the p-body concentration adjusting region 103a is thicker than the second channel region 106b which contacts with the second portion 103b", then it means herein that when respective portions of the first and second channel regions 106a and 106b which are located at the same depth in the trench are compared to each other, the first channel region 106a in contact with the p-body concentration adjusting region 103a is thicker than the second channel region 106b in contact with the second portion 103b. The channel layer 106 has been formed by growing SiC epitaxially.

An off-axis substrate is used as the SiC substrate and is arranged so that the first and second side surfaces 102t1 and 102t2 of the trench 102 intersect with the off-axis direction, and therefore, SiC has mutually different plane orientations on the first and second side surfaces 102t1 and 102t2. As a result, facet planes are produced around a shoulder portion on one side of the trench 102, and the source gas will be supplied at different rates to the first and second side surfaces 102t1 and 102t2. Consequently, the first and second channel regions 106a and 106b come to have mutually different thicknesses. In this embodiment, the vector representing a normal to the principal surface of the substrate 101 tilts in the <11-20> direction with respect to the vector representing a normal to a (0001) plane, and therefore, the facets planes are likely to be produced around the shoulder portion of the first side surface 102t1. That is why while the channel layer 106 is being formed by epitaxial growth, the source gas tends to be supplied more to the first side surface 102t1 rather than to the second side surface 102t2. As a result, the first channel region 106a on the first side surface 102t1 tends to be thicker than the second channel region 106b on the second side surface 102t2. It should be noted that the channel layer 106 has only to contact at least partially with either the p-body concentration adjusting region 103a or the second portion 103b. And the channel layer 106 does not have to be arranged in contact with the drift layer 102 at the bottom of the trench 102t.

The length of the first and second channel regions 106a and 106b (channel length) is as indicated by the double-headed arrow t in FIG. 1(a). That is to say, the length of the first and second channel regions 106a and 106b is the length of a portion of the channel layer 106 which contacts with either the body concentration adjusting region 103a or the second portion 103b. In other words, the length of the first and second channel regions 106a and 106b is the thickness of either the p-body concentration adjusting region 103a or the second portion 103b on the surface of the trench.

A gate insulating film 107 has been formed on the channel layer 106. A portion of the gate insulating film 107 which contacts with the first channel region 106a may be thinner than another portion of the gate insulating film 107 which contacts with the second channel region 106b. In this description, if "a portion of the gate insulating film 107 which contacts with the first channel region 106a is thinner than another portion of the gate insulating film 107 which contacts with the second channel region 106b", then it means herein that when measured at the same depth in the trench, a portion of the gate insulating film 107 in contact with the first channel region 106a is thinner than another portion of the gate insulating film 107 in contact with the second channel region 106b.

A gate electrode 108 has been formed on the gate insulating film 107. Meanwhile, a drain electrode 110 has been formed on the back surface of the substrate 101. The gate electrode 108 is covered with an interlevel dielectric film 111, which has holes 111c that are filled with an upper interconnect electrode 112. A plurality of source electrodes 109 are connected in parallel together with the upper interconnect electrode 112. A back surface interconnect electrode 113 has further been formed on the drain electrode 110. The drain electrode 110 corresponds to the second electrode according to the present invention.

The semiconductor element 100 shown in FIG. 1(a) includes a plurality of unit cells 100u. As shown in FIG. 1(b), each of those unit cells 100u may have a rectangular shape on a plan view, and those unit cells 100u are arranged in stripes. By arranging the unit cells 100u in stripes, the first and second side surfaces 102t1 and 102t2 will account for a higher percentage of all side surfaces of the trench 102t, and therefore, a particularly significant effect is achieved. However, the unit cell 100u may also have a square planar shape (such a cell is called a "square cell") and may even have a polygonal shape.

In FIG. 1(b), the planar shape of the trenches 102t is indicated by the dotted lines. Each of the trenches 102t has first and second side surfaces 102t1 and 102t2 which run in the longitudinal direction and third and fourth side surfaces 102t3 and 102t4 which run perpendicularly to the longitudinal direction. As shown in FIG. 1(b), on a plan view, each trench 102t has the shape of a rectangle, the first and second side surfaces 102t1 and 102t2 thereof form the longer sides of the rectangle, and the third and fourth side surfaces 102t3 and 102t4 thereof form the shorter sides of the rectangle.

Optionally, respective portions of the body region 103 which contact with the third and fourth side surfaces 102t3 and 102t4 may include a dopant of the second conductivity type in mutually different concentrations.

The MISFET threshold voltage (i.e., the threshold voltage of forward current) of this semiconductor element 100 will be identified herein by Vth. If this MISFET satisfies Vgs≥Vth (i.e., in transistor turned-ON mode), the drain electrode 110 and the source electrode 109 become electrically conductive with each other through the channel layer 106 (and if Vds>0 V is satisfied, ON-state current flows from the drain electrode 110 into the source electrode 109). On the other hand, if Vgs<Vth is satisfied, the MISFET turns OFF as a transistor. The threshold voltage Vth of the transistor is determined primarily by the concentrations of a dopant in the body concentration adjusting region 103a and the second portion 103b, the dopant concentration and thickness of the channel layer 106, and the thickness of the gate insulating film 107.

In the semiconductor element 100 of this embodiment, the concentrations in the body concentration adjusting region 103a and the second portion 103b are controlled according to the thicknesses of the channel layer 106 to be grown on the first and second side surfaces 102t1 and 102t2 of the trench 102t. That is to say, since the dopant concentration of the body concentration adjusting region 103a is controlled so that the first and second side surfaces 102t1 and 102t2 of the trench 102 that are opposed to each other have substantially the same Vth, an increase in the ON-state resistance of the trench type MISFET and deterioration in the swing characteristic thereof can be both minimized.

According to this embodiment, the thicknesses of the channel layer 106 and gate insulating film 107 to be formed on the first and second side surfaces 102t1 and 102t2 are measured in advance by some evaluation method such as cross-sectional SEM, and the dopant concentration of the body concentration adjusting region 103a is determined so as to make the threshold voltages on the first and second side surfaces 102t1 and 102t2 equal to each other. In the semiconductor element 100 shown in FIG. 1, the channel layer 106 is thicker on the first side surface 102t1 than on the second side surface 102t2, and the gate insulating film 107 is also thicker on the first side surface 102t1 than on the second side surface 102t2. That is why if the p-type dopant concentrations on the first and second side surfaces 102t1 and 102t2 are equal to each other, then the threshold voltage on the first side surface 102t1 becomes lower than the threshold voltage on the second side surface 102t2.

Figure 2:
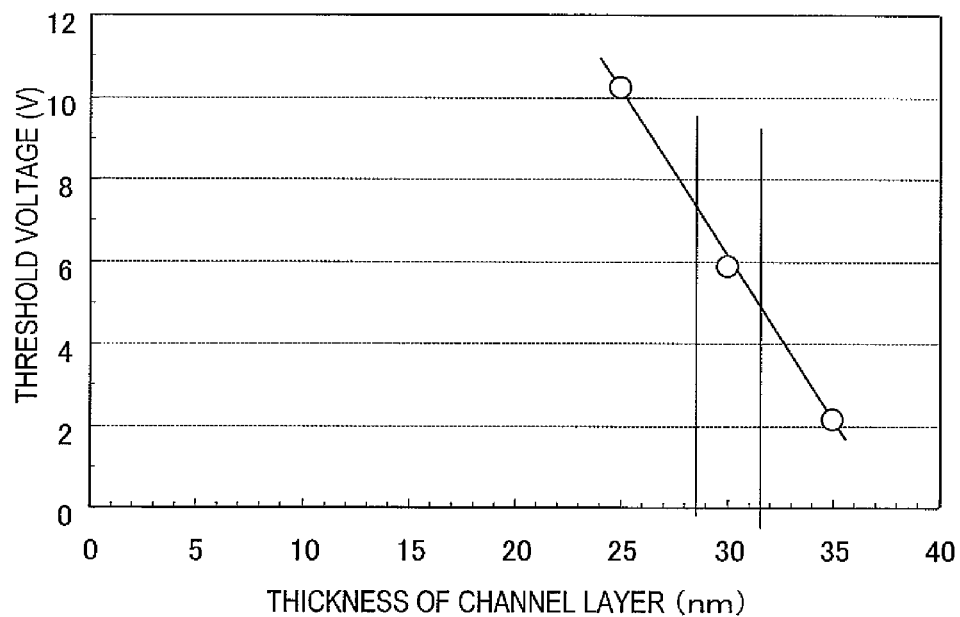
FIG. 2 A graph showing a correlation between the thickness of a channel layer and the threshold voltage in a semiconductor element 100 according to the first embodiment.

FIG. 2 shows the results of calculations that were made to plot a correlation between the thickness of the channel layer and the threshold voltage. In this case, the gate insulating film (silicon dioxide film) had a thickness of 70 nm, the channel layer had an n-type dopant concentration of $2 \times 10^{18}$ cm$^{-3}$, and the body region had a p-type dopant concentration of $1 \times 10^{19}$ cm$^{-3}$. As can be seen from this graph, when the channel layer has a thickness of 30 nm, the threshold voltage is 6 V. And if the thickness of the channel layer has varied by ±5% from 30 nm (i.e., if the thickness of the channel layer has varied within the range of 28.5 nm to 31.5 nm), then the threshold voltage comes to have a value of approximately 7 to 5 V. Thus, it can be seen that if the thickness of the channel layer varies by ±5%, the threshold voltage varies by ±1 V or more. That is to say, in the trench type MISFET, if the thicknesses of a channel layer on two opposing trench sidewall surfaces are different from each other by ±5%, then the threshold voltages on those two opposing trench sidewall surfaces will be different from each other by ±1 V or more.

According to this embodiment, the body concentration adjusting region 103a is formed so that the p-type dopant concentration becomes higher on one of the two trench side surfaces that has the thicker channel layer. As a result, the problem that the two opposing trench sidewall surfaces have mutually different threshold voltages can be overcome.

Figure 3:
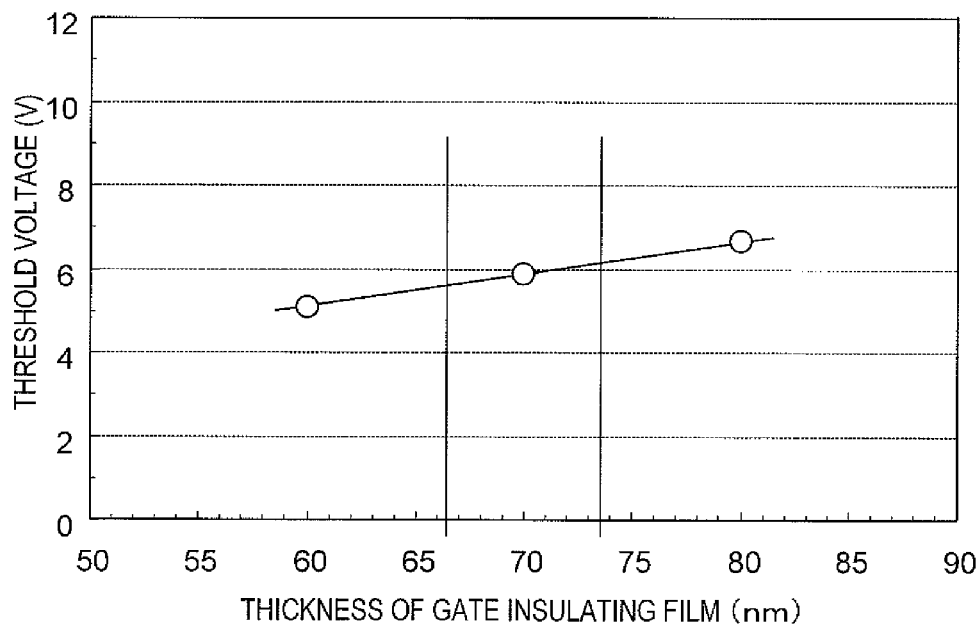
FIG. 3 A graph showing a correlation between the thickness of a gate oxide film and the threshold voltage in the semiconductor element 100 of the first embodiment.

The thickness of the gate insulating film also has some impact on the threshold voltage. FIG. 3 shows the results of calculations that were made to plot a correlation between the thickness of the gate insulating film and the threshold voltage. A silicon dioxide film was used as the gate insulating film, the channel layer had an n-type dopant concentration of $2 \times 10^{18}$ cm$^{-3}$ and a thickness of 30 nm, and the body region had a p-type dopant concentration of $1 \times 10^{19}$ cm$^{-3}$. As can be seen from this graph, when the gate insulating film has a thickness of 70 nm, the threshold voltage is 6 V. And if the thickness of the gate insulating film has varied by ±5% from 70 nm (i.e., if the thickness of the channel layer has varied within the range of 66.5 nm to 73.5 nm), then the threshold voltage comes to have a value of 5.6 to 6.2 V. Thus, it can be seen that if the thickness of the gate insulating film varies by ±5%, the threshold voltage varies by approximately ±0.3 V. Compared to the thickness of the channel layer, the thickness of the gate insulating film has less influence on the threshold voltage. However, even if the thicknesses of the gate insulating film on two opposing trench sidewall surfaces are different, the problem that the two opposing trench sidewall surfaces have different threshold voltages can still be overcome by forming the body concentration adjusting region 103a by the method of this embodiment.

Figure 4:
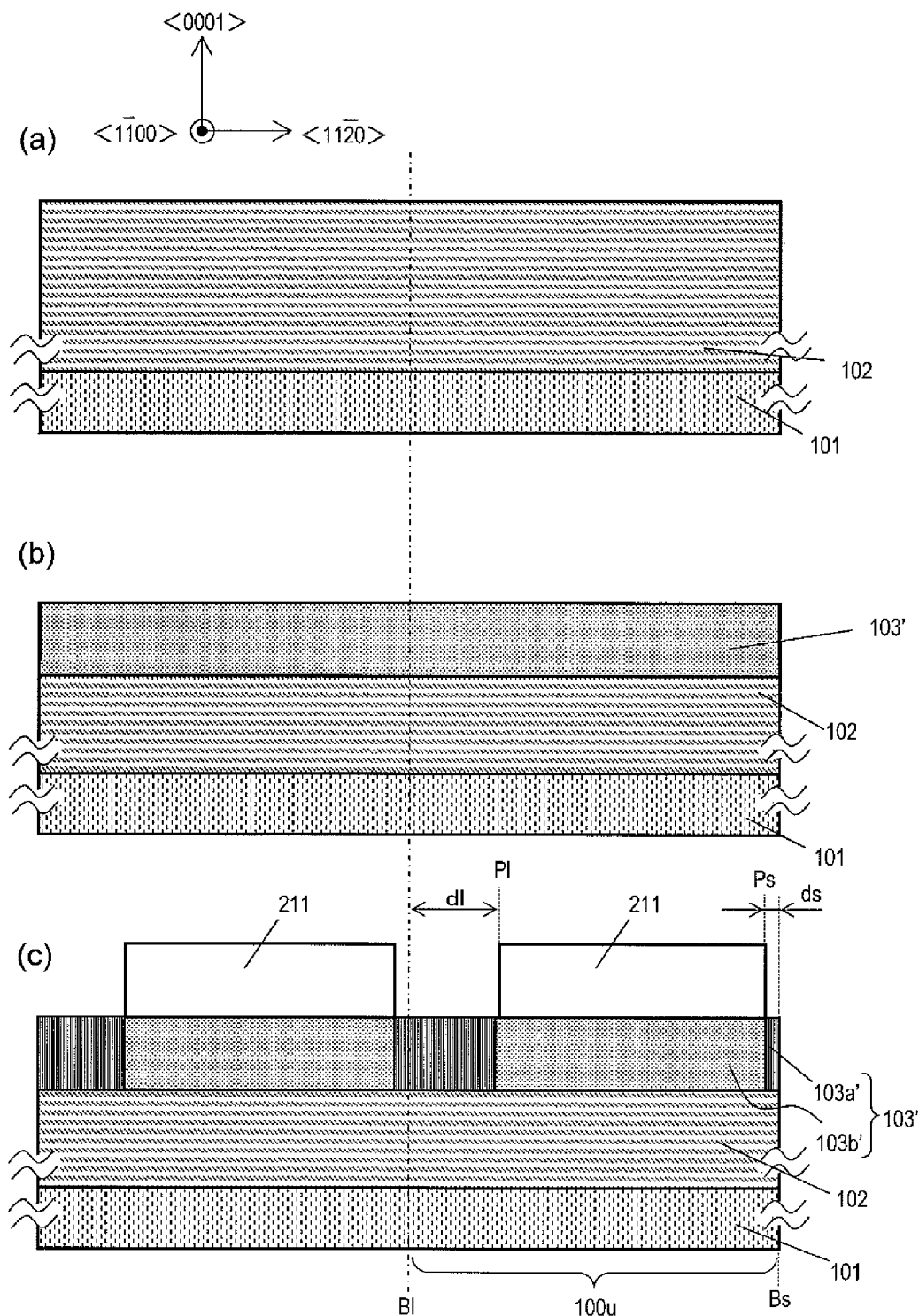
FIG. 4 (a) through (c) are cross-sectional views illustrating respective manufacturing process steps to produce the semiconductor element 100 of the first embodiment.
Figure 5:
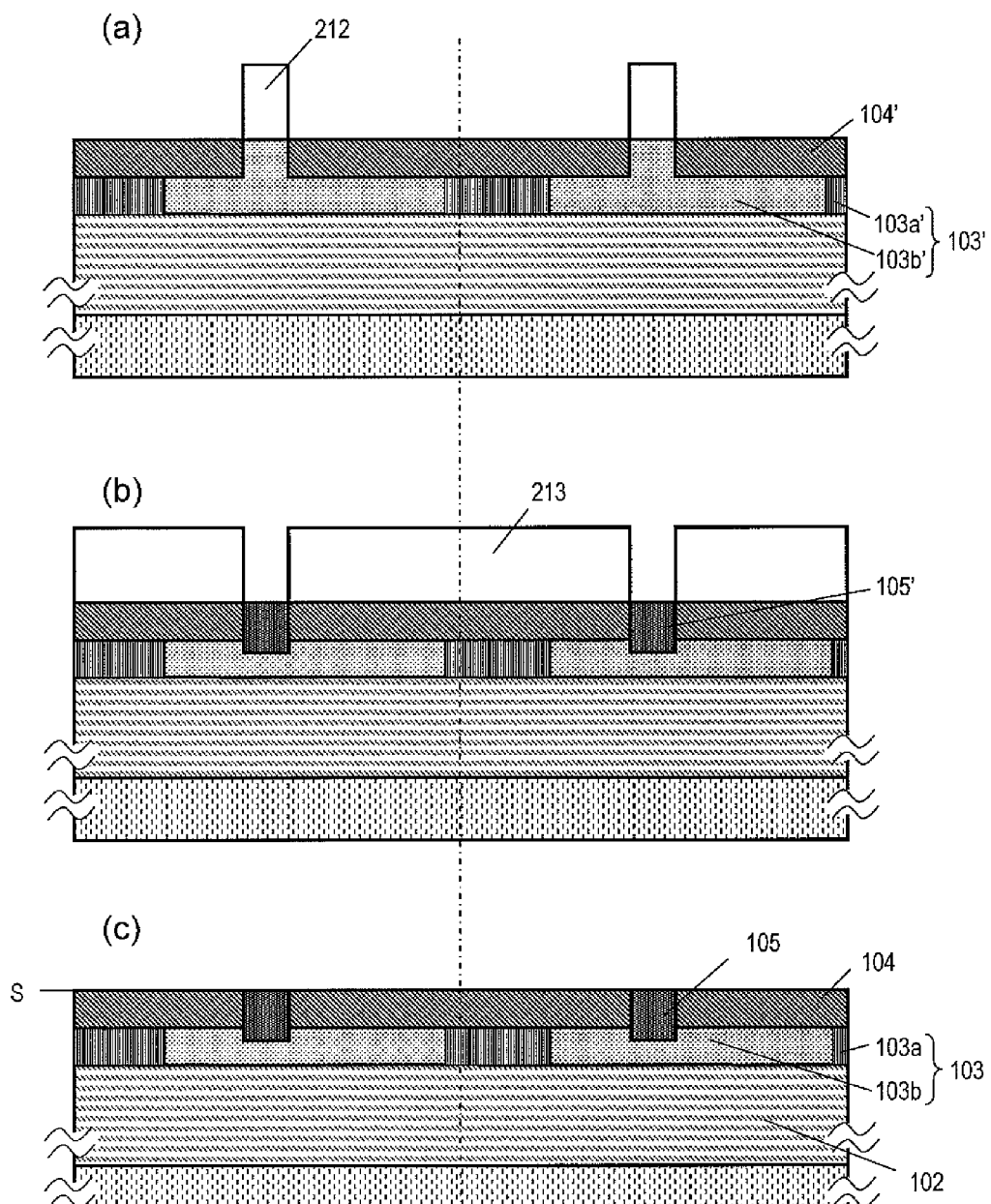
FIG. 5 (a) through (c) are cross-sectional views illustrating respective manufacturing process steps to produce the semiconductor element 100 of the first embodiment.
Figure 6:
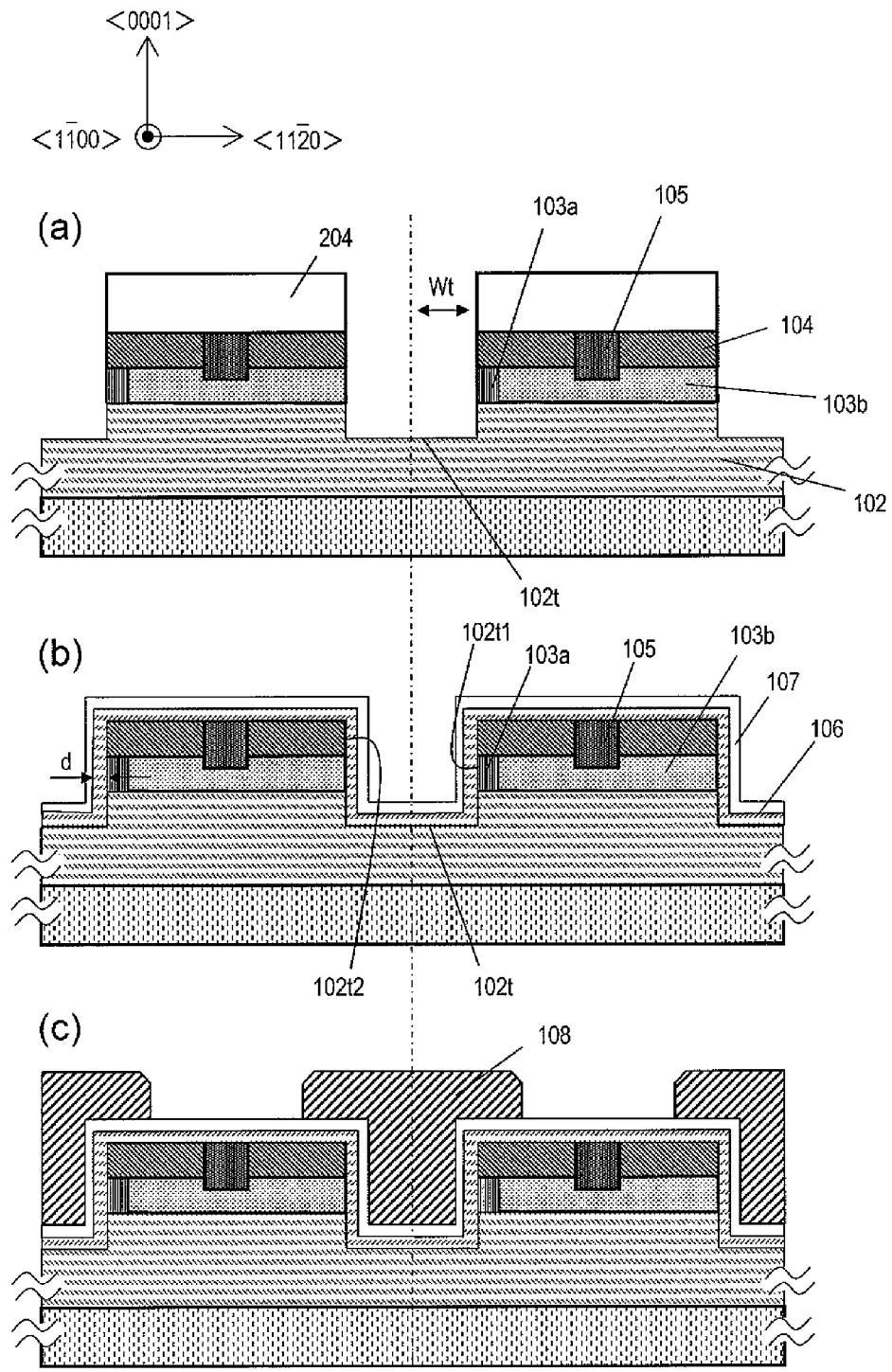
FIG. 6 (a) through (c) are cross-sectional views illustrating respective manufacturing process steps to produce the semiconductor element 100 of the first embodiment.
Figure 7:
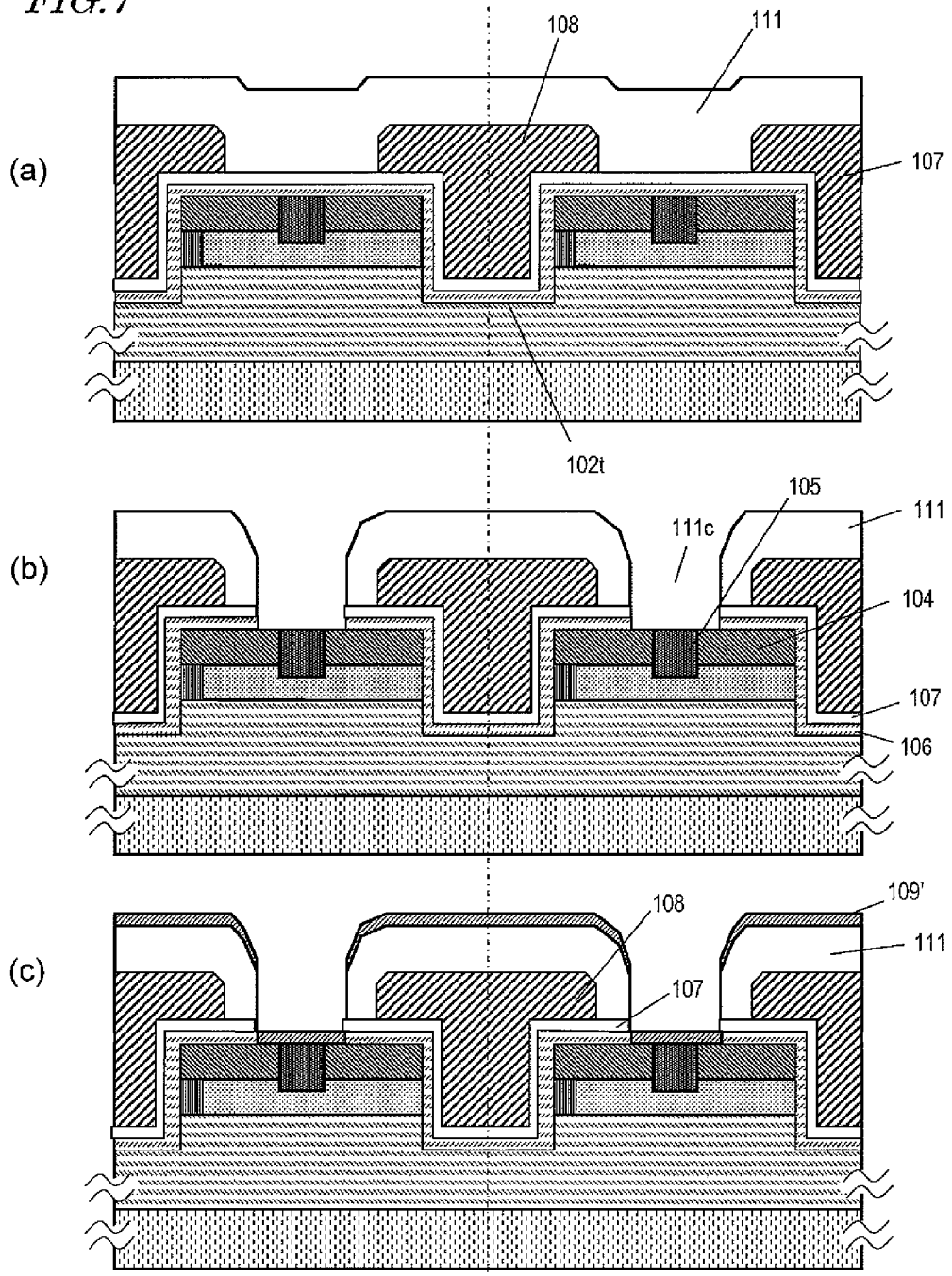
FIG. 7 (a) through (c) are cross-sectional views illustrating respective manufacturing process steps to produce the semiconductor element 100 of the first embodiment.
Figure 8:
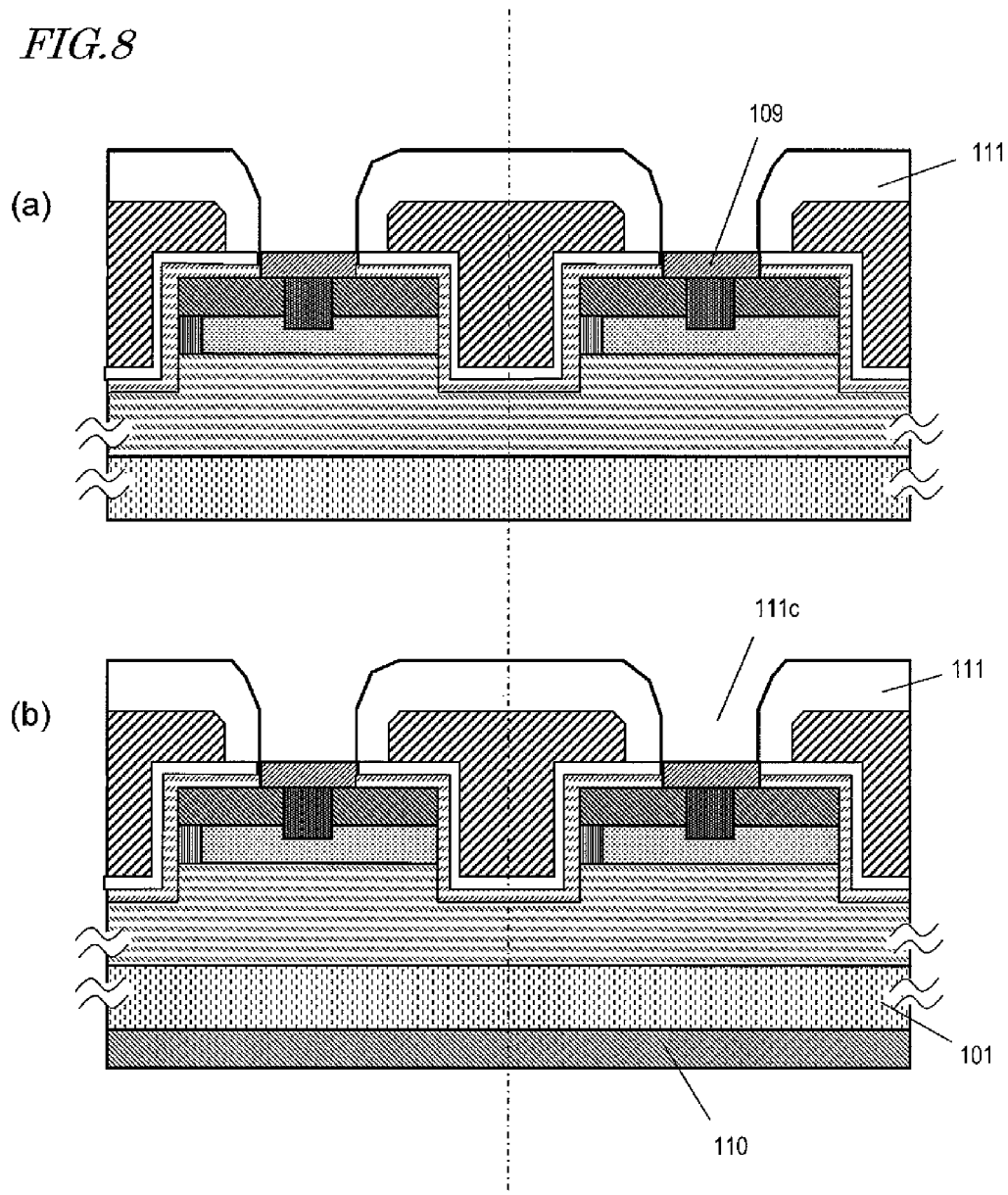
FIGS. 8 (a) and (b) are cross-sectional views illustrating respective manufacturing process steps to produce the semiconductor element 100 of the first embodiment.

Hereinafter, it will be described with reference to FIGS. 4 through 8 how to make the semiconductor element 100 of this embodiment. First of all, a substrate 101 is provided. The substrate 101 may be an n-type 4H—SiC (0001) Si plane off-cut substrate with low resistance (with a resistivity of 0.02 Ωcm). Alternatively, an SiC (000-1) C plane off-cut substrate may also be used as the substrate 101. A vector representing a normal to the principal surface of the substrate 101 tilts in the <11-20> direction with respect to a vector representing a normal to a (0001) plane and may define an off-axis angle of 4 degrees. According to this embodiment, however, the off-axis angle does not have to be 4 degrees but may fall within the range of 2 degrees to 10 degrees, for example. In FIG. 4, the direction pointing from the right to the left is supposed to indicate the <11-20> direction.

Next, as shown in FIG. 4(a), a high-resistance drift layer 102 is grown epitaxially on the substrate 101. An n-type 4H—SiC layer may be used as the drift layer 102, for example. The drift layer 102 may have a dopant concentration of $1 \times 10^{16}$ cm$^{-3}$ and a thickness of 10 μm, for example. Optionally, before the drift layer 102 is deposited, a buffer layer of low-resistance SiC may be deposited on the substrate 101. In that case, the buffer layer may have a dopant concentration of $1 \times 10^{18}$ cm$^{-3}$ and a thickness of 1 μm, for example.

Subsequently, as shown in FIG. 4(b), Al ions, for example, are implanted into an upper portion of the drift layer 102. The ion implanted region thus formed is a body implanted region 103' to be the body region 103 eventually. In FIG. 4(b), the body implanted region 103' has been formed over the entire surface of the unit cell 100u. The species of the ions to be implanted to form the body implanted region 103' may be aluminum, and its acceleration energies and implant doses may be changed from 500 KeV and $1 \times 10^{14}$ cm$^{-2}$ into 250 KeV and $5 \times 10^{13}$ cm$^{-2}$, 100 KeV and $1 \times 10^{13}$ cm$^{-2}$ and then 50 KeV and $5 \times 10^{12}$ cm$^{-2}$. If a peripheral structure needs to be formed in a ring shape in order to lessen the overconcentration of an electric field around the element, then a mask of SiO$_2$ may be formed in this process step to define a patterned body implanted region 103' in the peripheral region.

Since Al has a small diffusion coefficient, a variation in the concentration profile due to the diffusion of Al, if any, is almost negligible. If boron is used as a dopant for the body region, then the rate of activation and diffusion coefficient thereof need to be known in advance and then the energy and dose of the ions to be implanted may be determined to obtain an intended dopant concentration profile.

Next, as shown in FIG. 4(c), a mask 211 is formed and aluminum ions, for example, are implanted into the body implanted region 103' through the mask 211 to form a body concentration adjusting implanted region 103a', which comes to have a higher p-type dopant concentration than the second portion 103b'. In this process step, the implant energy and number of times of implantation may be the same as those of the body implanted region 103', for example, and the implant doses may be determined by the respective thicknesses of the first and second channel regions 106a and 106b to grow on the first and second side surfaces 102t1 and 102t2 of the trench 102t, for example. That is to say, the implant doses are adjusted so that the first and second channel regions 106a and 106b have substantially the same threshold voltage. For example, if the first and second channel regions 106a and 106b have a thickness of 100 nm and a thickness of 95 nm, respectively, the implant doses may be $4\times10^{14}$ cm$^{-2}$, $2\times10^{14}$ cm$^{-2}$, $4\times10^{13}$ cm$^{-2}$, and $2\times10^{13}$ cm$^{-2}$, respectively.

In this process step, the mask 211 is arranged with possible mask misalignment taken into account so that the body concentration adjusting implanted region 103a' will be located beside the first side surface 102t1 of the trench 102t. Specifically, in the cross section shown in FIG. 4(c), one end Pl of the mask 211 (i.e., the end that is located more distant from one end of the unit cell 100u) is arranged at a distance dl from the other end Bl of the unit cell 100u. This distance dl from that end Bl of the unit cell is set to be greater than the sum of a half of the trench's width (i.e., the width Wt shown in FIG. 6(a)), a half of the difference in the size (width) of a hole of a mask 204 to form the trench 102t from its designed value, the magnitude of misalignment (stacking error) to involve when a photomask to form the trench 102t is stacked on the wafer, and the magnitude of misalignment (stacking error) to involve when a photomask to form the body concentration adjusting region 103a is stacked on the wafer. By arranging the mask 211 at such a position, even if any error such as a mask misalignment has occurred, the body concentration adjusting region 103a can be arranged beside the first side surface 102t1 of the trench just as intended.

In the cross section shown in FIG. 4(c), the other end Ps of the mask 211 (i.e., the end that is located closer to the end of the unit cell 100u) is arranged at a distance ds from that end Bs of the unit cell 100u. This distance ds is set to be smaller than the value obtained by subtracting a half of the difference in the size (width) of a hole of a mask 204 to form the trench 102t from its designed value, the magnitude of misalignment (stacking error) to involve when a photomask to form the trench 102t is stacked on the wafer, and the magnitude of misalignment (stacking error) to involve when a photomask to form the body concentration adjusting region 103a is stacked on the wafer from a half of the trench's width (i.e., the width Wt shown in FIG. 6(a)). As a result, even if any error such as a mask misalignment has occurred, the second portion 103b can be arranged beside the second side surface 102t2 of the trench just as intended.

Next, after the mask 211 has been removed, another mask 212 is formed to define a source implanted region 104' as shown in FIG. 5(a). The dopant to be introduced in this process step may be nitrogen to be n-type.

After the ions have been implanted, the mask 212 is removed. Subsequently, still another mask 213 is formed and Al ions are implanted through it to define a contact implanted region 105' as shown in FIG. 5(b).

After these ion implantation process steps have been performed, the mask 213 is removed, and an annealing process for activation is carried out. In this manner, a body region 103, a source region 104 and a contact region 105 are formed as shown in FIG. 5(c). By forming the body concentration adjusting region 103a and the second portion 103b with the same implant energy, their depths can be substantially the same. For example, if the surface S of the drift layer 102 is supposed to be the reference surface, their depths are approximately 500 nm. The ion implantation profile is determined so that the body concentration adjusting region 103a has an average dopant concentration of approximately $5\times10^{19}$ cm$^{-3}$.

And the ion implantation profile is determined so that the body region has an average dopant concentration of approximately $1\times10^{19}$ cm$^{-3}$. Also, the source region is supposed to be located at a depth where a dopant concentration of $5\times10^{17}$ cm$^{-3}$ is obtained.

The contact region 105 may be located at a depth of 400 nm under the surface S as a reference surface and may have an average dopant concentration of approximately $1\times10^{20}$ cm$^{-3}$. The contact region 105 is supposed to be located at a depth where a dopant concentration of $5\times10^{17}$ cm$^{-3}$ is obtained.

Thereafter, as shown in FIG. 6(a), a mask 204 is formed to form a trench 102t which runs through the source region 104 and the body concentration adjusting region 103a to expose the drift layer 102. This trench 102t may be formed by subjecting this silicon carbide structure to a dry etching process using a mixture of chlorofluorocarbon and oxygen gases, for example. The center axis of the trench 102t needs to agree with the boundary between adjacent unit cells 100u. This trench 102t may have a width of approximately 1 μm and a depth of approximately 1.1 μm, for example. The mask 204 is made of a material that has tolerance to this dry etching process (such as aluminum). If the tolerance is insufficient, then a rather thick mask 204 may be formed. The hole width of the mask 204 that defines the trench 102t is set to be greater than the hole width of the mask 211 that defines the body concentration adjusting implanted region 103a'. By making such a design, the body concentration adjusting implanted region 103a' can be arranged on only one of the first and second side surfaces 102t1 and 102t2 of the trench 102t.

Next, the mask 204 is removed, the substrate is washed well, and then a channel layer 106 is grown epitaxially over the surface of the drift layer 102 as well as over the body concentration adjusting region 103a or the body region 103, the source region 104 and the contact region 105. The channel layer 106 may be grown by performing a thermal CVD process using silane (SiH$_4$) and propane (C$_3$H$_8$) gases as source gases, a hydrogen (H$_2$) gas as a carrier gas, and a nitrogen gas as a dopant gas, respectively. The channel layer 106 may have a dopant concentration of $1\times10^{17}$ cm$^{-3}$, for example. At least the sidewalls of the trench 102t (i.e., the first and second side surfaces 102t1 and 102t2) are covered with the channel layer 106. The thicknesses of the channel layer 106 on the side surfaces of the trench 102t need to be known in advance by evaluating, by cross-sectional SEM, a sample in which the channel layer was grown epitaxially on the same trench structure as this semiconductor element's. The difference in thickness between the right and left portions of the channel layer 106 to be formed on those side surfaces of the trench 102t varies according to the epitaxial growth condition. In this embodiment (in which the principal surface of the substrate defines a tilt angle of 4 degrees in the <11-20> direction with respect to a (0001) plane), it was known in advance, as a result of a cross-sectional SEM, that the epitaxial layer formed on the first side surface 102t1 of the trench 102t was approximately 5% thicker than the channel layer 106 formed on the second side surface 102t2.

Next, predetermined portions of the channel layer 106 are dry-etched as needed, and then a gate insulating film 107 is formed by thermal oxidation, for example, on the surface of the channel layer 106 as shown in FIG. 6(b). In this process step, the gate insulating film 107 has different thicknesses on the first and second side surfaces 102t1 and 102t2 of the trench 102t, and the thickness of the gate insulating film 107 also varies according to the crystal plane orientations of the first and second side surfaces 102t1 and 102t2 of the trench 102t. It is known, as a result of a cross-sectional SEM that was carried out in advance, that if the off-axis direction is a rightward direction (i.e., the <11-20> direction) as in this embodiment, the gate insulating film 107 is less thick on the right-hand side (i.e., on the first side surface 102t1) than on the left-hand side (i.e., on the second side surface 102t2) of the trench 102t.

Thereafter, a polysilicon film doped with phosphorus is deposited to a thickness of about 500 nm over the surface of the gate insulating film 107. In this manner, the trench 102t is filled with the polysilicon film.

Next, as shown in FIG. 6(c), the polysilicon film is dry-etched through a mask (not shown) to form a gate electrode 108 in an intended region.

Subsequently, as shown in FIG. 7(a), an interlevel dielectric film 111 of $SiO_2$, for example, is deposited to a thickness of 1.5 μm, for example, by CVD process over the surface of the gate electrode 108 and over the exposed portion of the gate insulating film 107, which is not covered with the gate electrode 108.

Next, as shown in FIG. 7(b), respective portions of the interlevel dielectric film 111, the gate insulating film 107 and the epitaxial layer 106 are dry-etched away through a mask (not shown) so that the surface of the contact region 105 and a part of the surface of the source region 104 are exposed. In this manner, holes (via holes) 111c are cut.

Thereafter, as shown in FIG. 7(c), a nickel film 109' is deposited to a thickness of about 50 nm, for example, on the interlevel dielectric film 111. After that, a heat treatment process is carried out at 950 degrees Celsius for five minutes within an inert atmosphere to make the nickel react with the surface of silicon carbide and form a source electrode 109 made of nickel silicide. Then, by removing the nickel film 109' on the interlevel dielectric film 111, the structure shown in FIG. 8(a) is obtained.

Next, as shown in FIG. 8(b), nickel is also deposited over the entire back surface of the substrate 101 and is also made to react with silicon carbide through a heat treatment process. In this manner, a drain electrode 110 is formed.

Subsequently, aluminum is deposited to a thickness of about 4 μm over the interlevel dielectric film 111 and inside the hole 111c and then selectively etched to form a predetermined pattern to obtain the source line (upper interconnect electrode) 112 shown in FIG. 1(a). Although not shown, a gate line (or gate pad) which contacts with the gate electrode is also formed in another region at an end of the chip. Finally, a stack of Ti/Ni/Ag is deposited on the back surface of the drain electrode 110 as a back surface interconnect electrode 113 for die bonding so that Ti contacts with the drain electrode 110. In this manner, the semiconductor element 100 shown in FIG. 1 is completed.

Embodiment 2

Figure 9:
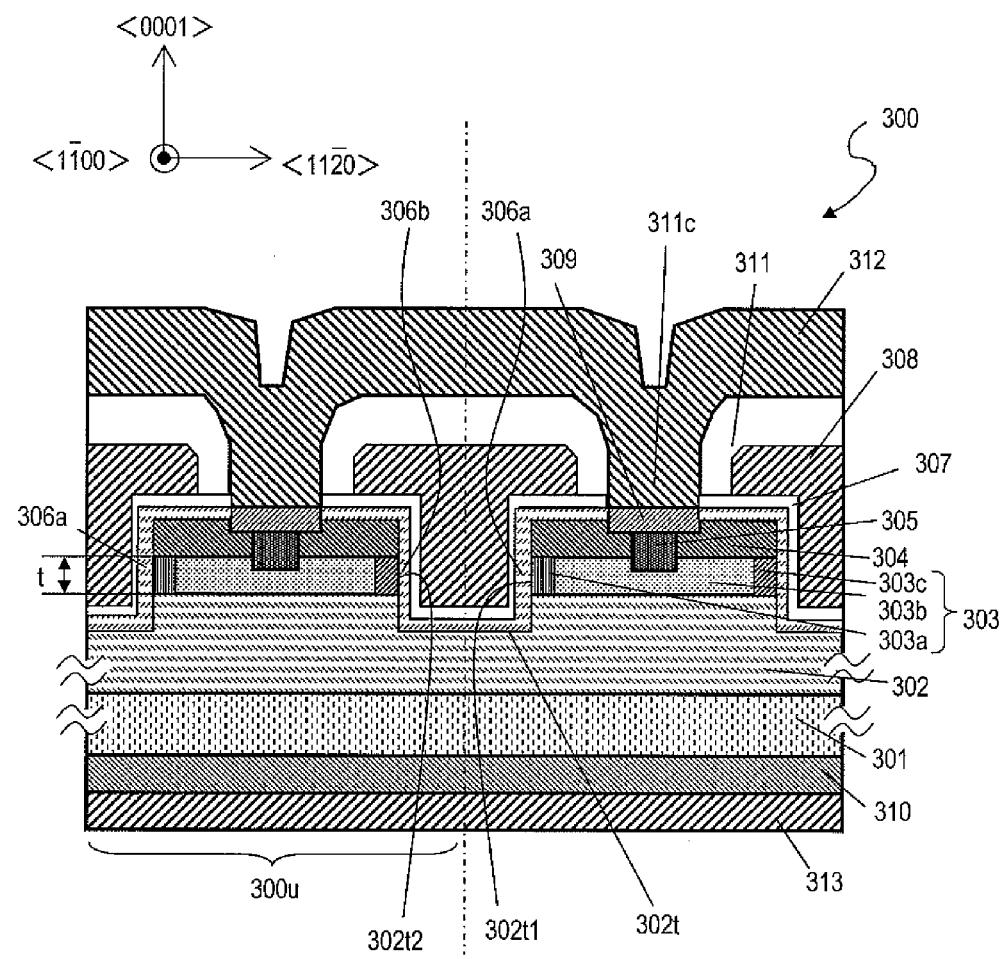
FIG. 9 A schematic cross-sectional view illustrating a semiconductor element 300 as a second exemplary embodiment.

FIG. 9 is a schematic cross-sectional view illustrating a semiconductor element 300 as a second embodiment of the present invention. In FIG. 9, illustrated are two adjacent unit cells 300u of the semiconductor element 300.

In the semiconductor element 300 shown in FIG. 9, the body region 303 includes a first body concentration adjusting region 303a, a second body concentration adjusting region 303c, and the other region 303b. On the first side surface 302t1 of each trench 302t, exposed is the first body concentration adjusting region 303a. On the second side surface 302t2, on the other hand, exposed is the second body concentration adjusting region 303c. The first body concentration adjusting region 303a may have an average dopant concentration of $1.2 \times 10^{18}$ cm$^{-3}$, for example. The second body concentration adjusting region 303c may have an average dopant concentration of $1 \times 10^{18}$ cm$^{-3}$, for example. The rest 303b of the body region 303 other than the first and second body concentration adjusting regions 303a and 303c may have an average dopant concentration of $8 \times 10^{17}$ cm$^{-3}$, for example. In the other respects, the semiconductor element 300 of this embodiment is the same as the semiconductor element 100 of the first embodiment.

According to this embodiment, the p-type dopant concentration can be controlled on both of the first and second side surfaces 302t1 and 302t2 of the trench 302t based on the thicknesses of the channel layer 306 and the gate insulating film 307. Consequently, the threshold voltage can be regulated more precisely.

Figure 10:
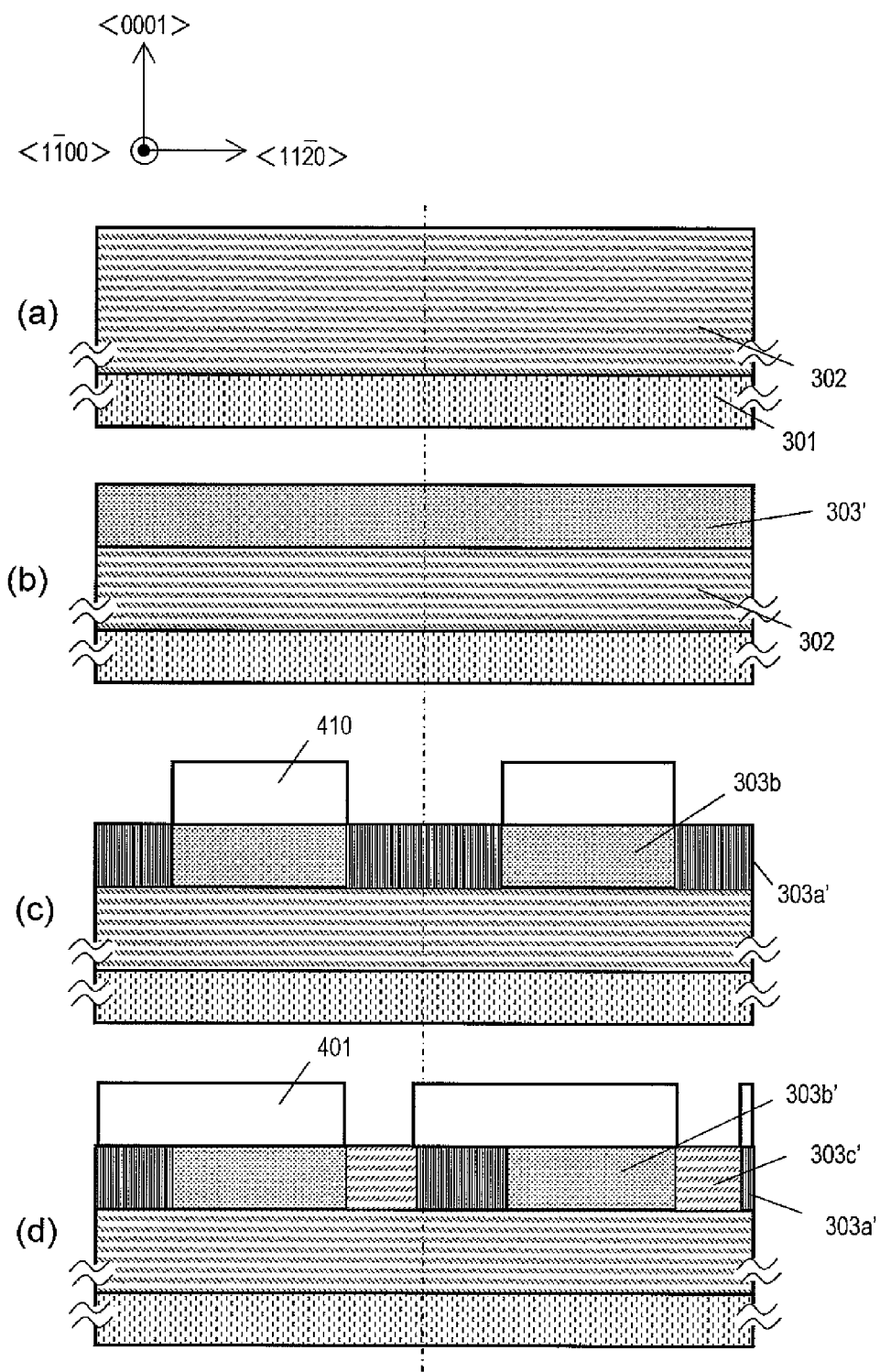
FIG. 10 (a) through (d) are cross-sectional views illustrating respective manufacturing process steps to produce the semiconductor element 300 of the second embodiment.
Figure 11:
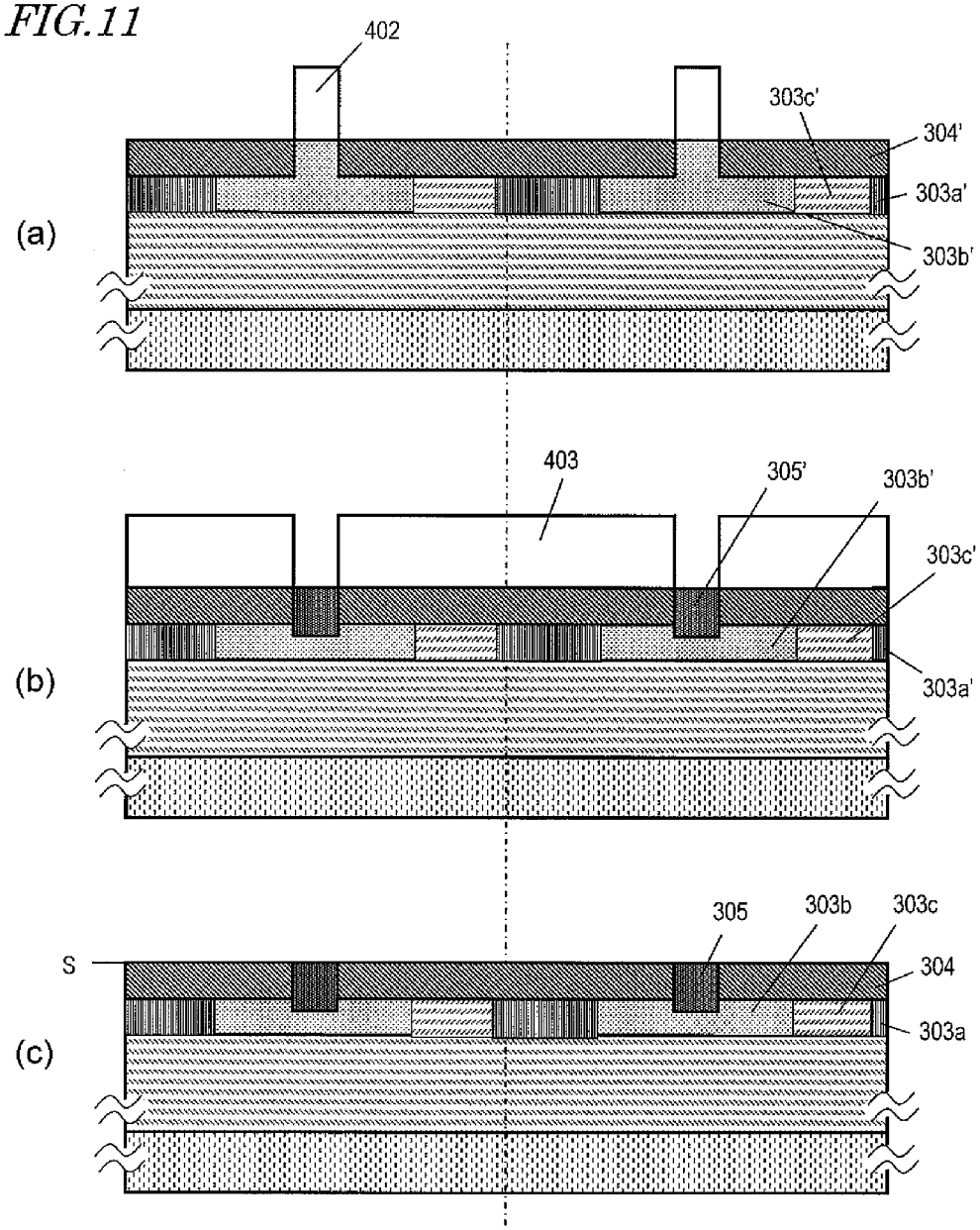
FIG. 11 (a) through (c) are cross-sectional views illustrating respective manufacturing process steps to produce the semiconductor element 300 of the second embodiment.
Figure 12:
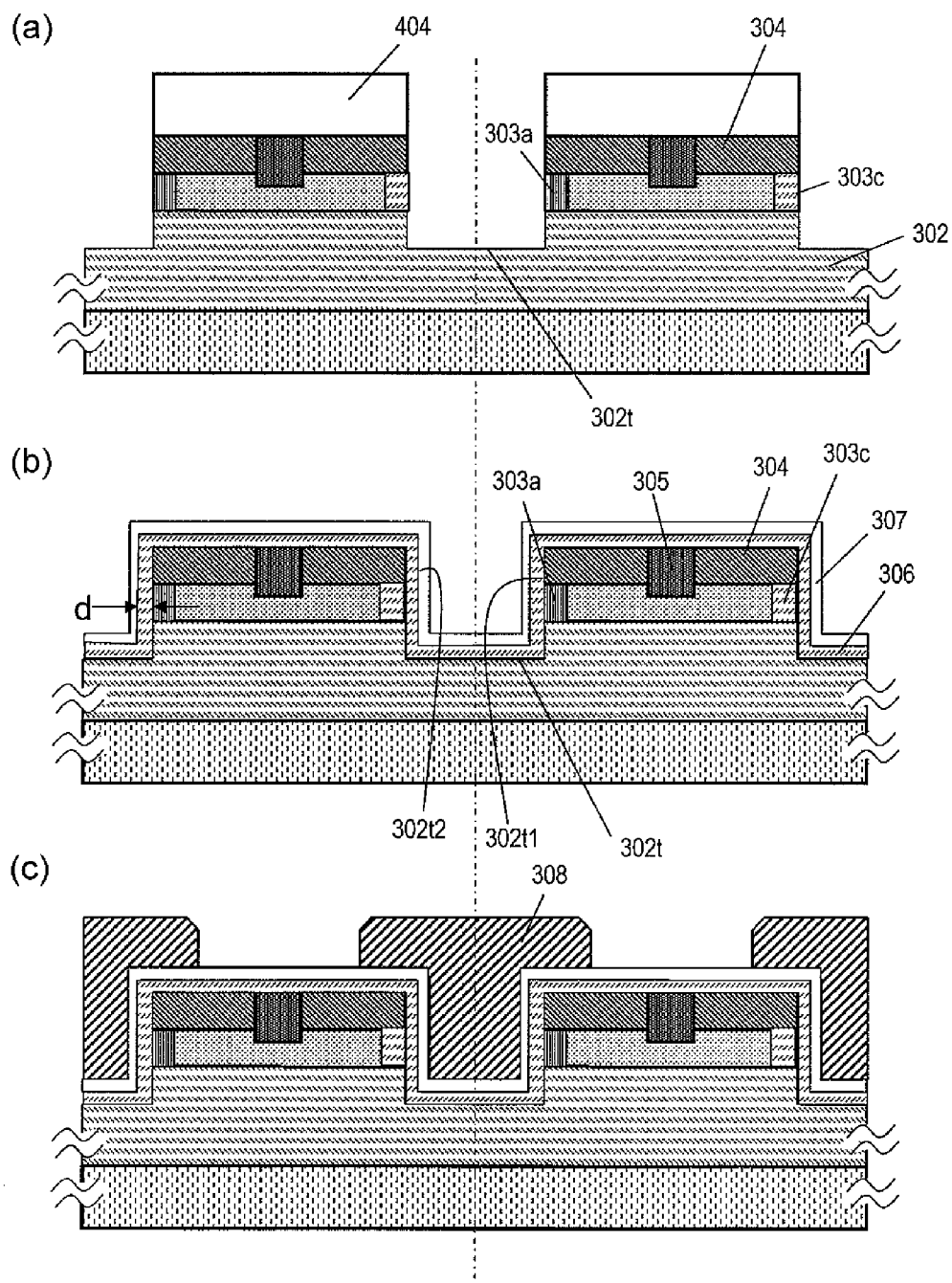
FIG. 12 (a) through (c) are cross-sectional views illustrating respective manufacturing process steps to produce the semiconductor element 300 of the second embodiment.
Figure 13:
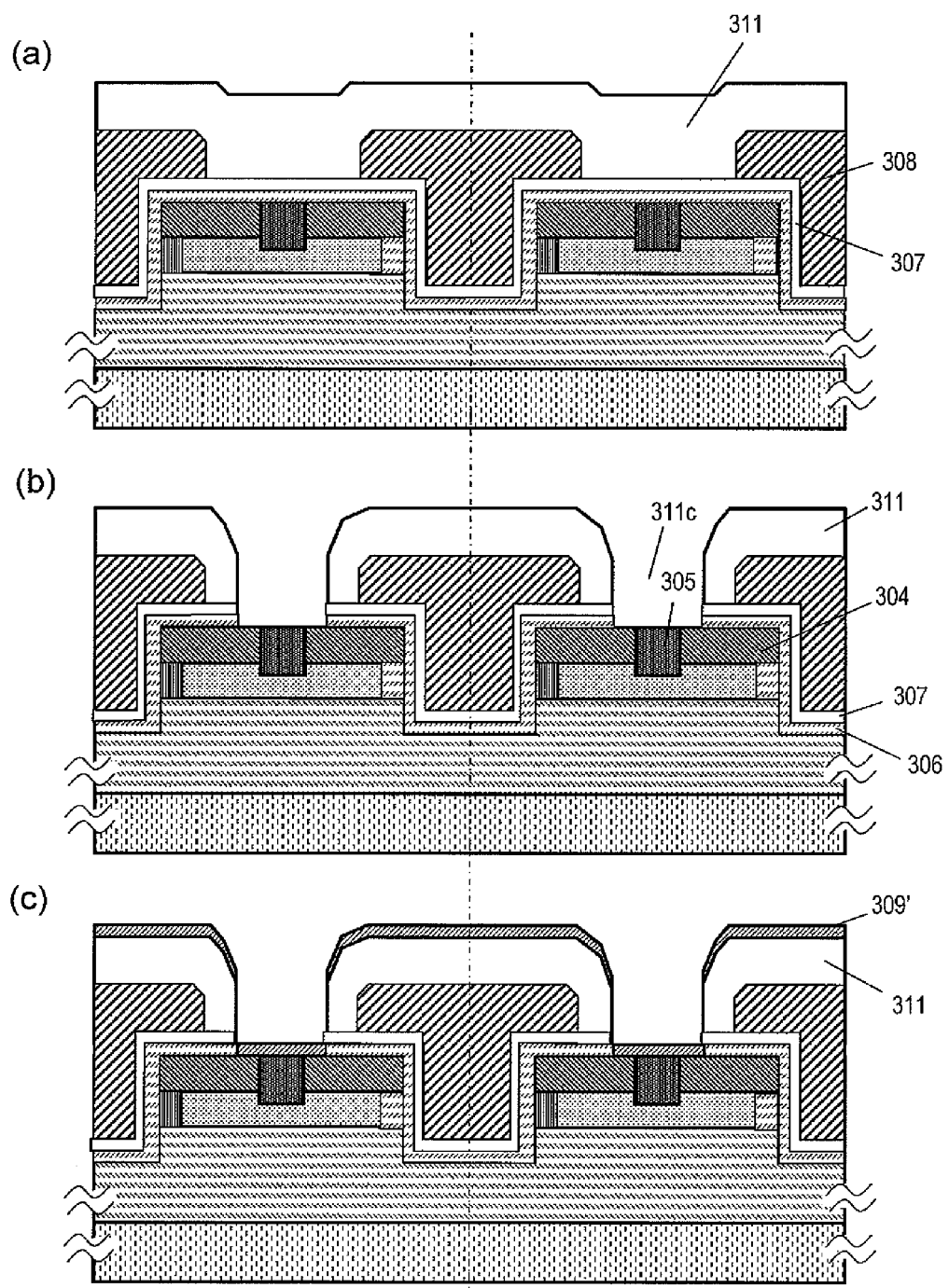
FIG. 13 (a) through (c) are cross-sectional views illustrating respective manufacturing process steps to produce the semiconductor element 300 of the second embodiment.

Hereinafter, it will be described with reference to FIGS. 10 through 14 how to make the semiconductor element of this embodiment. First of all, a substrate 301 is provided. The substrate 301 may be an n-type 4H—SiC (0001) Si plane off-cut substrate with low resistance (with a resistivity of 0.02 Ωcm). Alternatively, an SiC (000-1) C plane off-cut substrate may also be used as the substrate 101. A vector representing a normal to the principal surface of the substrate 101 tilts in the <11-20> direction with respect to a vector representing a normal to a (0001) plane and may define an off-axis angle of 4 degrees. In FIG. 10, the direction pointing from the right to the left is supposed to indicate the <11-20> direction.

Next, as shown in FIG. 10(a), a high-resistance drift layer 302 is grown epitaxially on the substrate 301. An n-type 4H—SiC layer may be used as the drift layer 302, for example. The drift layer 302 may have a dopant concentration of $1 \times 10^{16}$ cm$^{-3}$ and a thickness of 10 μm, for example. Optionally, before the drift layer 302 is deposited, a buffer layer with low-resistance may be deposited on the substrate 301. In that case, the buffer layer may have a dopant concentration of $1 \times 10^{18}$ cm$^{-3}$ and a thickness of 1 μm, for example.

Subsequently, as shown in FIG. 10(b), Al ions, for example, are implanted into an upper portion of the drift layer 302. The ion implanted region thus formed is a body implanted region 303' to be the body region 303 eventually. In FIG. 10(b), the body implanted region 303' has been formed over the entire surface of the unit cell 300u. The species of the ions to be implanted to form the body implanted region 303' may be aluminum, and its acceleration energies and implant doses may be changed from 500 KeV and $1 \times 10^{14}$ cm$^{-2}$ into 250 KeV and $5 \times 10^{13}$ cm$^{-2}$, 100 KeV and $1 \times 10^{13}$ cm$^{-2}$ and then 50 KeV and $5 \times 10^{12}$ cm$^{-2}$. If a peripheral structure needs to be formed in a ring shape in order to lessen the overconcentration of an electric field around the element, then a mask of $SiO_2$ may be formed in this process step to define a patterned body implanted region 303' in the peripheral region.

Since Al has a small diffusion coefficient, a variation in the concentration profile due to the diffusion of Al, if any, is almost negligible. If boron is used as a dopant for the body region, then the rate of activation and diffusion coefficient thereof need to be known in advance and then the energy and dose of the ions to be implanted may be determined to obtain an intended dopant concentration profile.

Next, as shown in FIG. 10(c), a mask 410 is formed and aluminum ions, for example, are implanted into the body implanted region 303' through the mask 410 to form a first body concentration adjusting implanted region 303a', which comes to have a higher p-type dopant concentration than the rest 303b' of the body implanted region 303' other than the first body concentration adjusting implanted region 303a'. In this process step, the implant energy and number of times of implantation may be the same as those of the body implanted region 103', for example, and the implant doses may be determined by the respective thicknesses of the first and second channel regions 306a and 306b to grow on the first and second side surfaces 302t1 and 302t2 of the trench 302t, for example. That is to say, the implant doses are adjusted so that the first and second channel regions 306a and 306b have substantially the same threshold voltage. For example, if the first and second channel regions 306a and 306b have a thickness of 100 nm and a thickness of 95 nm, respectively, the implant doses may be $4\times10^{14}$ cm$^{-2}$, $2\times10^{14}$ cm$^{-2}$, $4\times10^{13}$ cm$^{-2}$, and $2\times10^{13}$ cm$^{-2}$, respectively.

Next, as shown in FIG. 10(d), a mask 401 is formed to cover not only the rest 303b' of the body implanted region 303' other than the first body concentration adjusting implanted region 303a' but also a portion of the first body concentration adjusting implanted region 303a'. And nitrogen ions, for example, are implanted into the rest of the first body concentration adjusting implanted region 303a' through the mask 401 to form a second body concentration adjusting implanted region 303c', which comes to have a lower p-type dopant concentration than the first body concentration adjusting implanted region 303a'. In this process step, the implant energy and number of times of implantation may be the same as those of the body implanted region 103', for example, and the implant doses may be determined by the respective thicknesses of the first and second channel regions 306a and 306b to grow on the first and second side surfaces 302t1 and 302t2 of the trench 302t, for example. That is to say, the implant doses are adjusted so that the first and second channel regions 306a and 306b have substantially the same threshold voltage. For example, if the first and second channel regions 306a and 306b have a thickness of 100 nm and a thickness of 95 nm, respectively, the implant doses may be $4\times10^{14}$ cm$^{-2}$, $2\times10^{14}$ cm$^{-2}$, $4\times10^{13}$ cm$^{-2}$, and $2\times10^{13}$ cm$^{-2}$, respectively.

In the process steps shown in FIGS. 10(c) and 10(d), the masks 410 and 401 are arranged so that the first body concentration adjusting implanted region 303a' will be located beside one of the first and second side surfaces 302t1 and 302t2 of the trench 302t and that the second body concentration adjusting implanted region 303c' will be located beside the other side surface. In this case, the positions of the masks 410 and 401 are determined with possible exposure mask misalignment taken into account. Next, after the mask 401 has been removed, another mask 402 is formed to define a source implanted region 304' as shown in FIG. 11(a). The dopant to be introduced in this process step may be nitrogen to be n-type.

After the ions have been implanted, the mask 402 is removed. Subsequently, still another mask 403 is formed and Al ions are implanted through it to define a contact implanted region 305' as shown in FIG. 11(b).

After these ion implantation process steps have been performed, the mask 403 is removed, and an annealing process for activation is carried out. In this manner, a body region 103, a source region 104 and a contact region 105 are formed as shown in FIG. 11(c). By forming the first and second body concentration adjusting regions 303a and 303c with the same implant energy as the rest of the body region 103 other than the first and second body concentration adjusting region 303a and 303c, their depths can be substantially the same. For example, if the surface S of the drift layer 302 is supposed to be the reference surface, their depths are approximately 500 nm. The ion implantation profile is determined so that the first body concentration adjusting region 303a has an average dopant concentration of approximately $5\times10^{19}$ cm$^{-3}$. The ion implantation profile is determined so that the second body concentration adjusting region 303c has an average dopant concentration of approximately $1\times10^{19}$ cm$^{-3}$. And the ion implantation profile is determined so that the body region has an average dopant concentration of approximately $1\times10^{19}$ cm$^{-3}$. Also, the source region is supposed to be located at a depth where a dopant concentration of $5\times10^{17}$ cm$^{-3}$ is obtained.

The contact region 105 may be located at a depth of 400 nm under the surface S as a reference surface and may have an average dopant concentration of approximately $1\times10^{20}$ cm$^{-3}$. The contact region 105 is supposed to be located at a depth where a dopant concentration of $5\times10^{17}$ cm$^{-3}$ is obtained.

Thereafter, as shown in FIG. 12(a), a mask 404 is formed to form a trench 302t which runs through the source region 304 and the first and second body concentration adjusting regions 303a and 303c to expose the drift layer 302. This trench 302t may be formed by subjecting this silicon carbide structure to a dry etching process using a mixture of chlorofluorocarbon and oxygen gases, for example. This trench 102t may have a width of approximately 1 µm and a depth of approximately 1.1 µm, for example. The mask 204 is made of a material that has tolerance to this dry etching process (such as aluminum). If the tolerance is insufficient, then a rather thick mask 204 may be formed.

Next, the mask 404 is removed, the substrate is washed well, and then a channel layer (epitaxial layer) 306 is grown over the surface of the drift layer 302 as well as over the first and second body concentration adjusting regions 303a and 303c, the source region 304 and the contact region 305. In this manner, at least the sidewalls of the trench 302t (i.e., the first and second side surfaces 302t1 and 302t2) are covered with the channel layer 306. The thicknesses of the channel layer 306 on the side surfaces of the trench 302t need to be known in advance by evaluating, by cross-sectional SEM, a sample in which the channel layer was grown epitaxially on the same trench structure as this semiconductor element's. The difference in thickness between the right and left portions of the channel layer 306 to be formed on those side surfaces of the trench 302t varies according to the epitaxial growth condition. In this embodiment (in which the principal surface of the substrate defines a tilt angle of 4 degrees in the <11-20> direction with respect to a (0001) plane), it was known in advance, as a result of a cross-sectional SEM, that the channel layer 306 formed on the first side surface 302t1 of the trench 302t was approximately 5% thicker than the channel layer 306 formed on the second side surface 302t2.

Next, predetermined portions of the channel layer 306 are dry-etched as needed, and then a gate insulating film 307 is formed by thermal oxidation, for example, on the surface of the channel layer 306 as shown in FIG. 12(b). In this process step, the gate insulating film 307 has different thicknesses on the first and second side surfaces 302t1 and 302t2 of the trench 302t, and the thickness of the gate insulating film 307 also varies according to the crystal plane orientations of the first and second side surfaces 302t1 and 302t2 of the trench 302t. It is known, as a result of a cross-sectional SEM that was carried out in advance, that if the off-axis direction is a rightward direction (i.e., the <11-20> direction) as in this embodiment, the gate insulating film 307 is less thick on the right-hand side (i.e., on the first side surface 302t1) than on the left-hand side (i.e., on the second side surface 302t2) of the trench 302t.

Thereafter, a polysilicon film doped with phosphorus is deposited to a thickness of about 500 nm over the surface of the gate insulating film 107. In this manner, the trench 302t that has been formed through the drift layer 302 is filled with the polysilicon film.

Next, as shown in FIG. 12(c), the polysilicon film is dry-etched through a mask (not shown) to form a gate electrode 108 in an intended region.

Subsequently, as shown in FIG. 13(a), an interlevel dielectric film 311 of SiO$_2$, for example, is deposited to a thickness of 1.5 μm, for example, by CVD process over the surface of the gate electrode 308 and over the exposed portion of the gate insulating film 307, which is not covered with the gate electrode 308.

Next, as shown in FIG. 13(b), respective portions of the interlevel dielectric film 311, the gate insulating film 307 and the channel layer 306 are dry-etched away through a mask (not shown) so that the surface of the contact region 305 and a part of the surface of the source region 304 are exposed. In this manner, holes (via holes) 311c are cut.

Thereafter, as shown in FIG. 13(c), a nickel film 309' is deposited to a thickness of about 50 nm, for example, on the interlevel dielectric film 311. After that, a heat treatment process is carried out at 950 degrees Celsius for five minutes within an inert atmosphere to make the nickel react with the surface of silicon carbide and form a source electrode 309 made of nickel silicide. Then, by removing the nickel film 309' on the interlevel dielectric film 311, the structure shown in FIG. 14(a) is obtained.

Next, as shown in FIG. 14(b), nickel is also deposited over the entire back surface of the substrate 301 and is also made to react with silicon carbide through a heat treatment process. In this manner, a drain electrode 310 is formed.

Subsequently, aluminum is deposited to a thickness of about 4 μm over the interlevel dielectric film 311 and inside the via hole 311c and then selectively etched to form a predetermined pattern to obtain the source line (upper interconnect electrode) 312 shown in FIG. 9. Although not shown, a gate line (or gate pad) which contacts with the gate electrode is also formed in another region at an end of the chip. Finally, a stack of Ti/Ni/Ag is deposited on the back surface of the drain electrode 310 as a back surface interconnect electrode 313 for die bonding so that Ti contacts with the drain electrode 310. In this manner, the semiconductor element 300 shown in FIG. 9 is completed.

Figure 18:
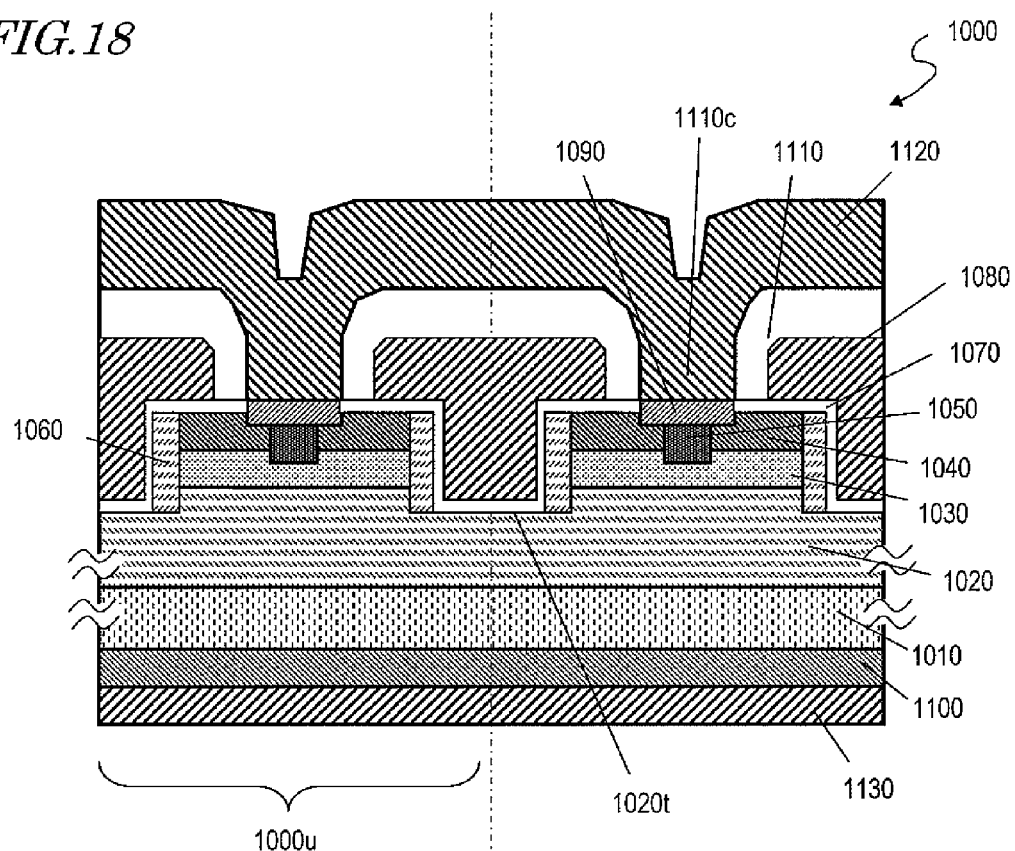
FIG. 18 A cross-sectional view schematically illustrating a traditional semiconductor element.

Supposing the chip size of each unit cell of a traditional trench type MISFET shown in FIG. 18 is the same as the semiconductor elements 100 and 300 shown in FIGS. 1 and 9, the semiconductor elements 100 and 300 of the first and second embodiments would have lower ON-state resistance than the semiconductor element shown in FIG. 18. In addition, the semiconductor elements 100 and 300 of the first and second embodiments would have improved swing characteristic, which is defined by a gate voltage that needs to be applied to increase the amount of drain current by one digit, compared to the semiconductor element shown in FIG. 18.

The reason is probably as follows. Specifically, in the semiconductor elements 100 and 300 of the first and second embodiments, according to the thickness of a channel layer to be grown on the two opposing side surfaces of a trench, the concentration of a p-type dopant in a body region that contacts with that channel layer is changed, and therefore, the threshold voltages are substantially the same on those two opposing side surfaces of the trench.

On the other hand, in the semiconductor element shown in FIG. 18, portions of the channel layer on the two opposing side surfaces of a trench have mutually different thicknesses, and yet the body region in contact with those portions of the channel layer has the same concentration. That is why the threshold voltages on the two opposing side surfaces of the trench are different from each other. Consequently, in the MISFET shown in FIG. 18, in some cases, even when ON-state current is flowing through a portion of the channel layer on one trench sidewall, no ON-state current might be flowing through the other trench sidewall. In such a situation, the ON-state resistance would increase and the swing characteristic would deteriorate.

In this case, if there is a significant difference in threshold voltage between those two opposing side surfaces of a trench, then the resultant electrical characteristic would be the one to get the source-drain current Ids once saturated when the gate-source voltage Vgs reaches a certain value and to make the source-drain current Ids rise again if the gate-source voltage Vgs is further increased. In that case, the ON-state resistance would increase and the swing characteristic would deteriorate as described above. On the other hand, the semiconductor elements 100 and 300 of the first and second embodiments do not exhibit such a characteristic but have such a characteristic that the source-drain current Ids continues to increase as the gate-source voltage Vgs rises. And to realize such a good characteristic, the difference in threshold voltage between those two opposing side surfaces of the trench may be equal to or smaller than 0.1 V. If the difference in threshold voltage is 0.1 V or less, increase in ON-state resistance and deterioration of the swing characteristic can be checked or suppressed sufficiently.

Figure 15:
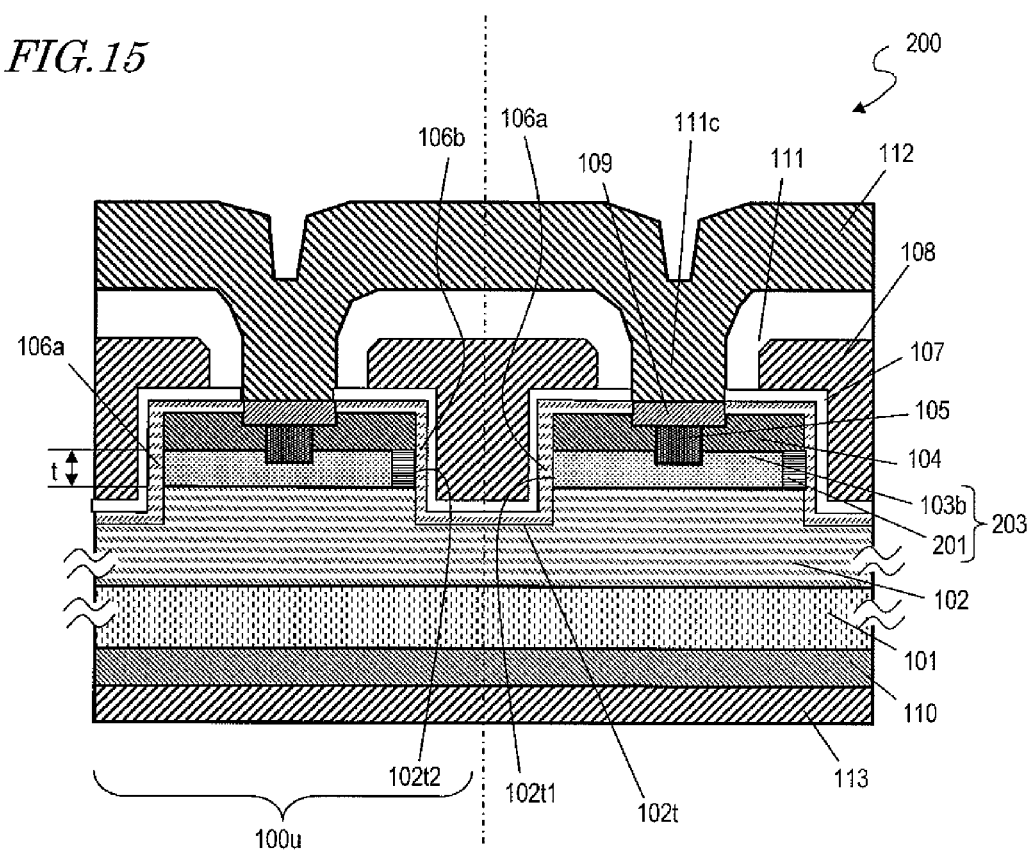
FIG. 15 A schematic cross-sectional view illustrating a semiconductor element 200 as another exemplary embodiment.

In the first embodiment described above, the body concentration adjusting region 103a is supposed to be formed by implanting ions of a p-type dopant. However, such a body concentration adjusting region which compensates for a concentration in the body region may also be formed by implanting ions of an n-type dopant. FIG. 15 illustrates the structure of such a semiconductor element. In this semiconductor element 200, the body concentration adjusting region 201 has been formed by implanting ions of an n-type dopant. The body concentration adjusting region 201 is arranged beside the second side surface 102t2 of each trench 102t. By implanting an n-type dopant into the body region 203 in this manner, the carrier concentration can be compensated for and the concentration of the p-type dopant in the body concentration adjusting region 201 can be lower than in the second portion 103b. That is why if the channel layer 106 is thicker, and the gate insulating film 107 is less thick, on the first side surface 102t1, the threshold voltage can be kept constant by forming the body concentration adjusting region 201 in a portion of the body region 203 beside the second side surface 102t2. The semiconductor element 200 shown in FIG. 15 has the same configuration as the semiconductor element 100 shown in FIG. 1 except that an n-type dopant has been implanted into the body concentration adjusting region 201. In the semiconductor element shown in FIG. 15, first of all, after a p-type dopant has been implanted into a body implanted region (to be the body region 203 through a heat treatment), an n-type dopant is implanted to form the body concentration adjusting region 201. The implant dose (concentration) of the n-type dopant to be introduced to form the body concentration adjusting region 201 is set to be less than the implant dose of the p-type dopant to be introduced to form the body region 203. As a result, the body concentration adjusting region 201 becomes a p-type region which has a lower p-type carrier concentration than the second portion 103b. Optionally, in the semiconductor element 300 shown in FIG. 9, an n-type dopant may be implanted into the body concentration adjusting region 303b.

Figure 16:
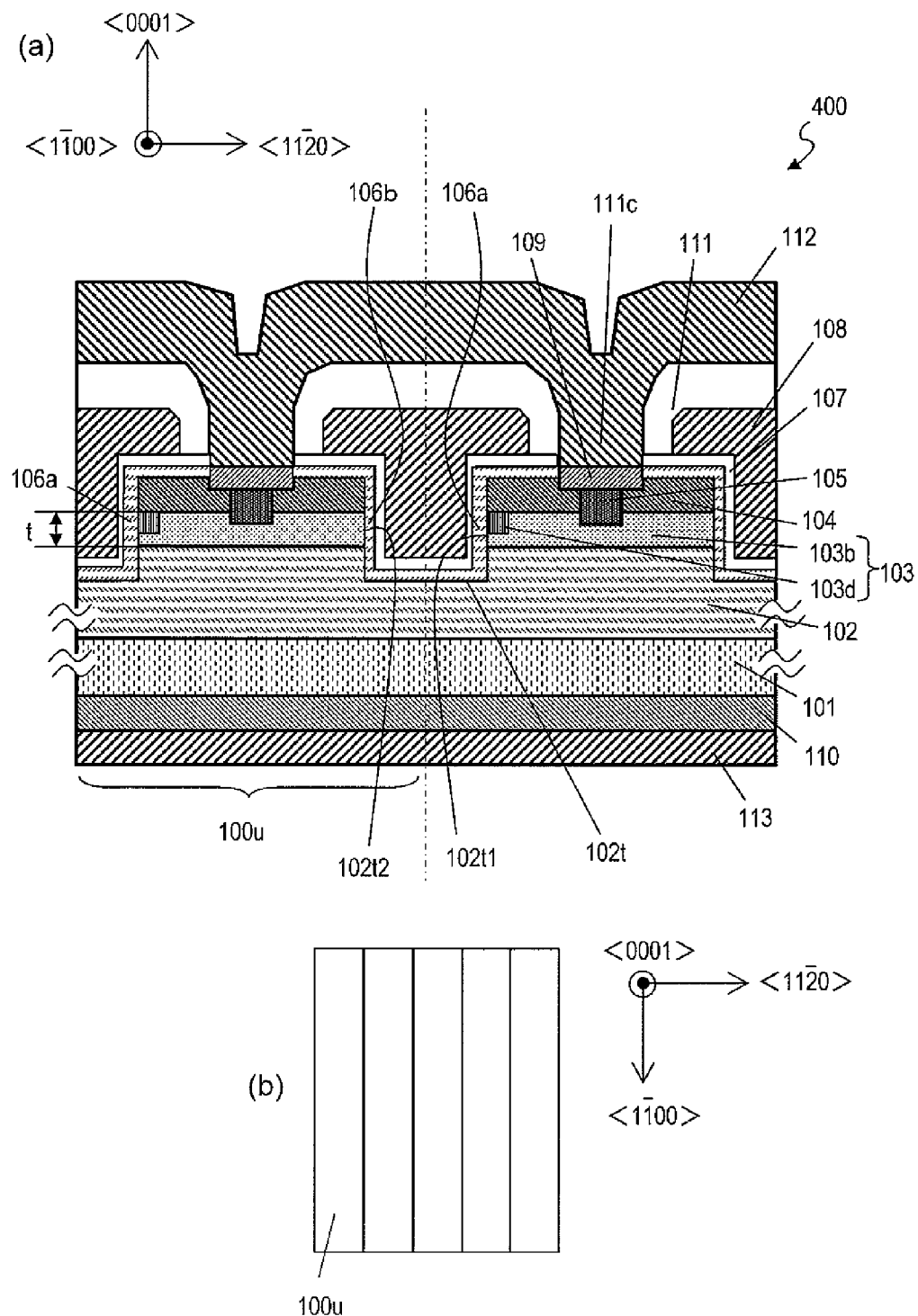
FIG. 16 A cross-sectional view illustrating a semiconductor element 400 as still another exemplary embodiment.

FIG. 16 is a cross-sectional view illustrating a semiconductor element 400 as another embodiment of the present invention. In the semiconductor element 400 shown in FIG. 16, the body concentration adjusting region 103d is shallower than the second portion 103b. In this manner, the body concentration adjusting region 103d may be arranged only in some depth range of the body region 103. In the manufacturing process of the semiconductor element 400 shown in FIG. 16, the implant energy of the ion implantation process to form the body concentration adjusting region 103d is set to be lower than the implant energy of the ion implantation process to form the body region 103. In this manner, the depth of the body concentration adjusting region 103d can be less than that of the second portion 103b.

In the embodiments described above, the source region, source electrode and drain electrode respectively correspond to the impurity region of the first conductivity type, first electrode, and second electrode according to the present invention.

Figure 17:
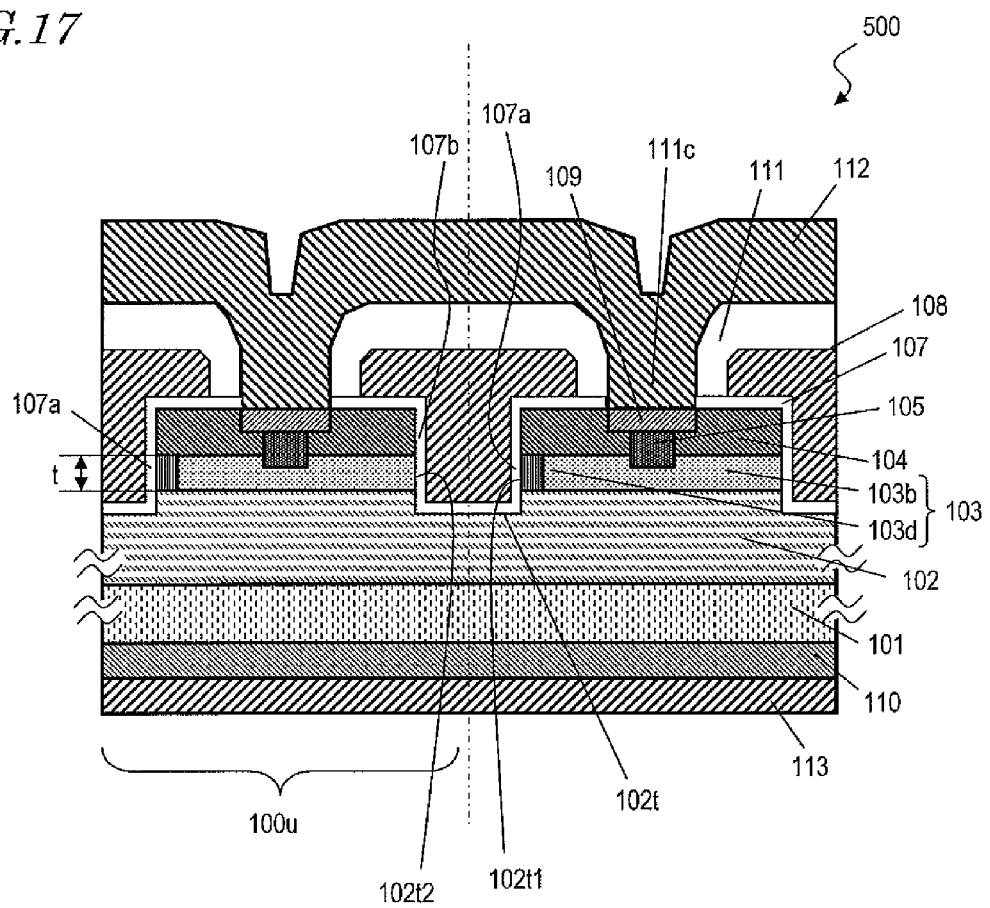
FIG. 17 A cross-sectional view illustrating a semiconductor element 500 as yet another exemplary embodiment.

Also, in the embodiments described above, the semiconductor element is supposed to be an accumulation type MISFET having a channel layer. However, this is just an example of the present invention. The semiconductor element may also be an inversion type MISFET with no channel layer (epitaxial layer). FIG. 17 illustrates a configuration for such a semiconductor element with no channel layer. In the semiconductor element 500 shown in FIG. 17, by applying a voltage to the gate electrode 108, the conductivity type of a portion of the body region 103, which is located opposite from the gate electrode 108 with the gate insulating film 107 interposed between them, can be inverted locally, thereby forming a channel there (and such a structure is called an "inverted channel structure"). Even in such an inverted channel structure, the thickness of the gate insulating film 107 also affects the threshold voltages at the first and second side surfaces 102t1 and 102t2 of the trench 102t. That is why by adjusting the dopant concentrations in portions of the body region which are located beside the first and second side surfaces 102t1 and 102t2, the threshold voltages can be equal to each other.

In the embodiments described above, the channel layer is supposed to have mutually different thicknesses on two opposing sidewall surfaces of a trench. However, this is only an example of the present invention. Even if the channel layer has mutually different concentrations on two opposing sidewall surfaces of a trench, the threshold voltages at those two opposing side surfaces of the trench can be substantially equal to each other by forming a body concentration adjusting region with ions of a p-type or n-type dopant implanted there.

Furthermore, even though the plane orientation of the trench's sidewall surfaces is supposed to substantially agree with the <11-20> direction in the embodiments described above, the sidewall surfaces do not have to have such a plane orientation.

Furthermore, in the embodiments described above, the silicon carbide semiconductor element is supposed to be implemented as a trench type MISFET. However, this is just an embodiment of the present invention. Alternatively, the silicon carbide semiconductor element of the present invention may also be implemented as an insulated gate bipolar transistor (IGBT) or junction field-effect transistor (JFET) with such a trench type structure.

For example, if the substrate and the semiconductor layer formed thereon have mutually different conductivity types, then an IGBT can be formed. In the case of an IGBT, however, the source electrode, drain electrode and source region are called an emitter electrode, a collector electrode and an emitter region, respectively.

Thus, if in the silicon carbide semiconductor element described above, the conductivity type of its drift region and emitter region is set to be n-type and the conductivity type of its substrate and body region is set to be p-type, an n-type IGBT can be obtained. In that case, an n-type buffer layer may be arranged between the p-type substrate and the n-type drift layer. Conversely, if the conductivity type of its drift region and emitter region is set to be p-type and the conductivity type of its substrate and body region is set to be n-type, a p-type IGBT can be obtained. In that case, a p-type buffer layer may be arranged between the n-type substrate and the p-type drift layer.

Furthermore, even though silicon carbide is supposed to be 4H—SiC in the embodiments described above, silicon carbide according to the present invention may also have any other poly-type (such as 6H—SiC, 3C—SiC, or 15R—SiC). Also, the plane orientation of the principal surface is supposed to be an off-cut one with respect to a (0001) plane, the principal surface may also be any other plane (such as a (11-20) plane, a (1-100) plane or a (000-1) plane) or an off-cut plane thereof. Still alternatively, the substrate may even be made of Si, and the drift layer may have a heterojunction formed by silicon carbide (e.g., 3C—SiC).

INDUSTRIAL APPLICABILITY

An SiC semiconductor device according to an aspect of the present invention can be used as a power element that is required to cause low loss.

REFERENCE SIGNS LIST 100, 200, 1000 semiconductor element
100u, 1000u unit cell
101, 1010 substrate (silicon carbide semiconductor substrate)
102, 1020 drift layer (first silicon carbide semiconductor layer)
103a, 201 body concentration adjusting region
103b second portion
103, 1030 body region
104, 1040 source region
105, 1050 body contact region (contact region)
106, 1060 channel layer (epitaxial layer)
106c channel portion
107, 1070 gate insulating film
108, 1080 gate electrode
109, 1090 source electrode
110, 1100 drain electrode
211, 212, 213 mask
111, 1110 interlevel dielectric film
112, 1120 upper interconnect electrode
113, 1130 back surface interconnect electrode (lower interconnect electrode)
1020t trench

The invention claimed is:

1. A silicon carbide semiconductor element comprising:
a semiconductor substrate of a first conductivity type;
a drift layer of the first conductivity type which is located on the principal surface of the semiconductor substrate;
a body region of a second conductivity type which is located on the drift layer;
an impurity region of the first conductivity type which is located on the body region;
a trench which runs through the body region and the impurity region to reach the drift layer;
a gate insulating film which is arranged on surfaces of the trench;
a gate electrode which is arranged on the gate insulating film;
a first electrode which contacts with the impurity region;
a second electrode which is arranged on the back surface of the semiconductor substrate; and
a channel layer of the first conductivity type, wherein the surfaces of the trench include a first side surface and a second side surface which is opposed to the first side surface, wherein the channel layer is arranged between the first and second side surfaces of the trench and the gate insulating film, wherein a portion of the channel layer which contacts with a part of the body region that is exposed on the first side surface is thicker than another portion of the channel layer which contacts with another part of the body region that is exposed on the second side surface, and wherein the concentration of a dopant of the second conductivity type is higher at least locally in a portion of the body region which is located beside the first side surface than in another portion of the body region which is located beside the second side surface.

2. The silicon carbide semiconductor element of claim 1, wherein a body concentration adjusting region including the dopant of the second conductivity type in a higher concentration than the body region is provided at least in some depth range of the portion of the body region which is located beside the first side surface.

3. The silicon carbide semiconductor element of claim 1, wherein a body concentration adjusting region including the dopant of the second conductivity type in a lower concentration than the body region is provided at least in some depth range of the portion of the body region which is located beside the second side surface.

4. The silicon carbide semiconductor element of claim 1, wherein the semiconductor substrate is a 4H—SiC substrate, of which the principal surface defines a tilt angle of 2 to 10 degrees with respect to either a (0001) Si plane or a (000-1) C plane.

5. The silicon carbide semiconductor element of claim 1, wherein the first and second side surfaces are arranged substantially perpendicularly to the direction in which the principal surface of the semiconductor substrate tilts with respect to the (0001) Si plane or the (000-1) C plane.

6. The silicon carbide semiconductor element of claim 1, wherein the principal surface of the semiconductor substrate tilts in a <11-20> direction with respect to the (0001) Si plane or the (000-1) C plane and wherein the first and second side surfaces are arranged substantially perpendicularly to the <11-20> direction.

7. The silicon carbide semiconductor element of claim 1, wherein the channel layer of the first conductivity type has been formed by epitaxial growth.

8. The silicon carbide semiconductor element of claim 1, wherein a difference in threshold voltage between the two opposing sidewall surfaces of the trench is equal to or smaller than 0.1 V.

9. The silicon carbide semiconductor element of claim 1, wherein when viewed perpendicularly to the principal surface of the semiconductor substrate, the trench has the shape of a rectangle on a plan view, and wherein the first and second side surfaces form the longer sides of the rectangle.

* * * * *